US012613814B2

(12) United States Patent
Lee

(10) Patent No.: US 12,613,814 B2
(45) Date of Patent: Apr. 28, 2026

(54) DEVICES USING CHIPLET BASED STORAGE ARCHITECTURES

(71) Applicant: SK hynix Inc., Icheon-si (KR)

(72) Inventor: Dong Sop Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 47 days.

(21) Appl. No.: 17/898,975

(22) Filed: Aug. 30, 2022

(65) Prior Publication Data

US 2023/0080284 A1 Mar. 16, 2023

(30) Foreign Application Priority Data

Sep. 10, 2021 (KR) ........................ 10-2021-0121036
Jun. 2, 2022 (KR) ........................ 10-2022-0067871

(51) Int. Cl.
| | |
|---|---|
| *G06F 13/16* | (2006.01) |
| *G06F 13/40* | (2006.01) |
| *G06F 13/42* | (2006.01) |
| *H01L 25/065* | (2023.01) |

(52) U.S. Cl.
CPC ...... *G06F 13/1668* (2013.01); *G06F 13/4022* (2013.01); *G06F 13/4221* (2013.01); *H01L 25/0652* (2013.01)

(58) Field of Classification Search
CPC ............. G06F 13/1668; G06F 13/4022; G06F 13/4221; H01L 25/0652; H01L 25/18; H01L 2225/06562; H01L 2225/06572
USPC ......................................... 710/305
See application file for complete search history.

(56) References Cited

U.S. PATENT DOCUMENTS

| | | | |
|---|---|---|---|
| 6,597,232 B1 * | 7/2003 | Burnham | .............. G06F 11/201 |
| | | | 714/E11.078 |
| 7,415,002 B2 * | 8/2008 | Martin | .................. H04J 3/0697 |
| | | | 370/510 |
| 7,958,285 B1 | 6/2011 | Chiu et al. | |
| 9,910,814 B2 | 3/2018 | Spry et al. | |
| 11,487,316 B2 | 11/2022 | Margalit et al. | |
| 11,593,024 B1 | 2/2023 | Isenegger | |
| 12,174,757 B1 | 12/2024 | Akavaram et al. | |
| 2005/0005082 A1 | 1/2005 | Au et al. | |
| 2005/0089012 A1 * | 4/2005 | Martin | .................. H04J 3/0697 |
| | | | 370/519 |
| 2009/0271651 A1 | 10/2009 | Pothireddy et al. | |
| 2010/0131704 A1 | 5/2010 | Mannen et al. | |

(Continued)

FOREIGN PATENT DOCUMENTS

| | | |
|---|---|---|
| CN | 113312304 A | 8/2021 |
| KR | 100407176 B1 | 11/2003 |

(Continued)

OTHER PUBLICATIONS

Office Action for TW Appl. No. 111134051, mailed on Feb. 10, 2026, 12 pages.

*Primary Examiner* — Chun Kuan Lee
(74) *Attorney, Agent, or Firm* — Perkins Coie LLP

(57) ABSTRACT

A device for implementing a storage architecture includes a front-end chip configured to perform first interfacing with a first device, and a plurality of back-end chips configured to perform second interfacing with second devices. The front-end chip includes front-end links for communication with the plurality of back-end chips, and the plurality of back-end chips include back-end links for communication with the front-end links.

26 Claims, 26 Drawing Sheets

(56) References Cited

U.S. PATENT DOCUMENTS

| | | | |
|---|---|---|---|
| 2010/0237484 A1 | 9/2010 | Han et al. | |
| 2011/0084744 A1* | 4/2011 | Nishioka | G11C 29/50012 |
| | | | 327/161 |
| 2017/0147624 A1* | 5/2017 | Burger | H03M 7/3086 |
| 2018/0063280 A1 | 3/2018 | Gay et al. | |
| 2018/0095910 A1 | 4/2018 | Kulick et al. | |
| 2018/0253493 A1 | 9/2018 | Busayarat et al. | |
| 2019/0163228 A1* | 5/2019 | Gupta | G06F 1/12 |
| 2020/0185367 A1* | 6/2020 | Bhagavat | H01L 25/16 |
| 2020/0294557 A1 | 9/2020 | Ware et al. | |
| 2021/0382967 A1* | 12/2021 | Goergen | H04L 9/3263 |
| 2021/0406165 A1 | 12/2021 | Lindberg et al. | |
| 2022/0336417 A1* | 10/2022 | Chong | H01L 23/5386 |
| 2022/0383961 A1* | 12/2022 | Lien | G11C 16/08 |
| 2023/0186142 A1 | 6/2023 | Mladenov et al. | |
| 2024/0264911 A1 | 8/2024 | Lee | |
| 2024/0273041 A1 | 8/2024 | Lee | |
| 2024/0371422 A1 | 11/2024 | Lim et al. | |
| 2024/0403236 A1 | 12/2024 | Park et al. | |
| 2024/0427522 A1 | 12/2024 | Lee et al. | |

FOREIGN PATENT DOCUMENTS

| | | |
|---|---|---|
| KR | 20210037531 A | 4/2021 |
| KR | 20210135996 A | 11/2021 |
| KR | 20210137231 A | 11/2021 |
| KR | 20230038082 A | 3/2023 |
| TW | I692723 B | 5/2020 |

* cited by examiner

SUB BACK-END CHIP

SBE1.
LINK

DEVICES USING CHIPLET BASED STORAGE ARCHITECTURES

PRIORITY CLAIM AND CROSS-REFERENCE TO RELATED APPLICATIONS

This patent document claims the priority and benefits of Korean Patent Application No. 10-2021-0121036, filed on Sep. 10, 2021, and Korean Patent Application No. 10-2022-0067871, filed on Jun. 2, 2022, which are incorporated herein by reference in its entirety.

TECHNICAL FIELD

Embodiments of the disclosed technology relate to storage architectures, and more particularly, to chiplet based storage architectures.

BACKGROUND

Limited system resources in various implementations of data storage systems or devices may not meet the needs for such data storage systems or devices, including data storages systems or devices implemented with recent system flexibility features. For example, when a storage architecture is configured in a form of a monolithic integrated circuit, a single skeleton integrated circuit, or a system-on-chip (Soc), the storage architecture has host devices coupled to the storage architecture and an interface that is subordinate to the standard of memory media. This indicates an example of a limitation that the storage architecture is valid only for host devices and memory media of specific standards.

SUMMARY

A storage architecture according to an embodiment of the disclosed technology may include a front-end chip configured to perform first interfacing with a first device, and a plurality of back-end chips configured to perform second interfacing with second devices. The front-end chip may include front-end links for communication with the plurality of back-end chips, and the plurality of back-end chips may include back-end links for communication with the front-end links.

A storage architecture according to an embodiment of the disclosed technology may include a front-end chip configured to perform first interfacing with a first device, a first back-end chip configured to perform second interfacing with a second device, and a second back-end chip configured to perform third interfacing with a third device. The front-end chip may include a first front-end link for communication with the first back-end chip, and a second front-end link for communication with the second back-end chip. The first back-end chip may include a first back-end link for communication with the first front-end link. The second back-end chip may include a second back-end link for communication with the second front-end link.

A storage architecture according to an embodiment of the disclosed technology may include a front-end chip configured to perform first interfacing with a first device, and a first back-end package and a second back-end package that are coupled to the front-end chip. The front-end chip may include first and second front-end links for communication with the first and second back-end packages. The first back-end package may include a first back-end chip having a first back-end link for communication with the first front-end link and a first memory chip in a package format. The second back-end chip may include a second back-end chip and a second memory chip having a second back-end link for communication with the second front-end link and a second memory chip in a package format.

A storage architecture according to an embodiment of the disclosed technology may include a front-end chip configured to perform first interfacing with a first device, a back-end package coupled to the front-end package, and a plurality of sub back-end packages indirectly coupled to the front-end chip through the back-end package. The front-end chip may include a front-end links for communication with the back-end package, and the back-end package and the plurality of sub back-end packages are coupled to each other in a daisy chain scheme.

A storage architecture according to an embodiment of the disclosed technology may include a front-end chip configured to perform first interfacing with a first device and including a first front-end link and a second front-end link, a back-end chip configured to perform second interfacing with a second device and including a first back-end link coupled to the first front-end link, a back-end package including a second back-end link that is coupled to the second front-end link of the front-end chip, and a plurality of sub back-end packages indirectly coupled to the front-end chip through the back-end package. The back-end package and the plurality of sub back-end packages may be coupled to each other in a daisy chain format.

BRIEF DESCRIPTION OF THE DRAWINGS

FIG. 3 is a block diagram illustrating a back-end chip that constitutes a storage architecture according to an embodiment of the disclosed technology.

FIG. 4 is a block diagram illustrating a back-end chip that constitutes a storage architecture according to another embodiment of the disclosed technology.

FIG. 5 is a block diagram illustrating a back-end chip that constitutes a storage architecture according to yet another embodiment of the disclosed technology.

FIG. 6 is a block diagram illustrating a back-end chip that constitutes a storage architecture according to yet another embodiment of the disclosed technology.

FIG. 7 is a block diagram illustrating a back-end chip that constitutes a storage architecture according to yet another embodiment of the disclosed technology.

FIG. 9 is a block diagram illustrating a back-end chip that constitutes a storage architecture according to still yet another embodiment of the disclosed technology.

FIG. 11 is a block diagram illustrating an example of a configuration of the front-end chip of the storage architecture of FIG. 10.

FIG. 13 is a cross-sectional diagram illustrating an example of a configuration of a first back-end package of the storage architecture of FIG. 12.

FIG. 15 is a cross-sectional diagram illustrating an example of a configuration of a first back-end package of the storage architecture of FIG. 14.

FIG. 16 is a cross-sectional diagram illustrating an example of a first sub back-end package of the storage architecture of FIG. 14.

FIG. 18 is a diagram illustrating an example of a storage module that employs a storage architecture according to an embodiment of the disclosed technology.

Figure 21:
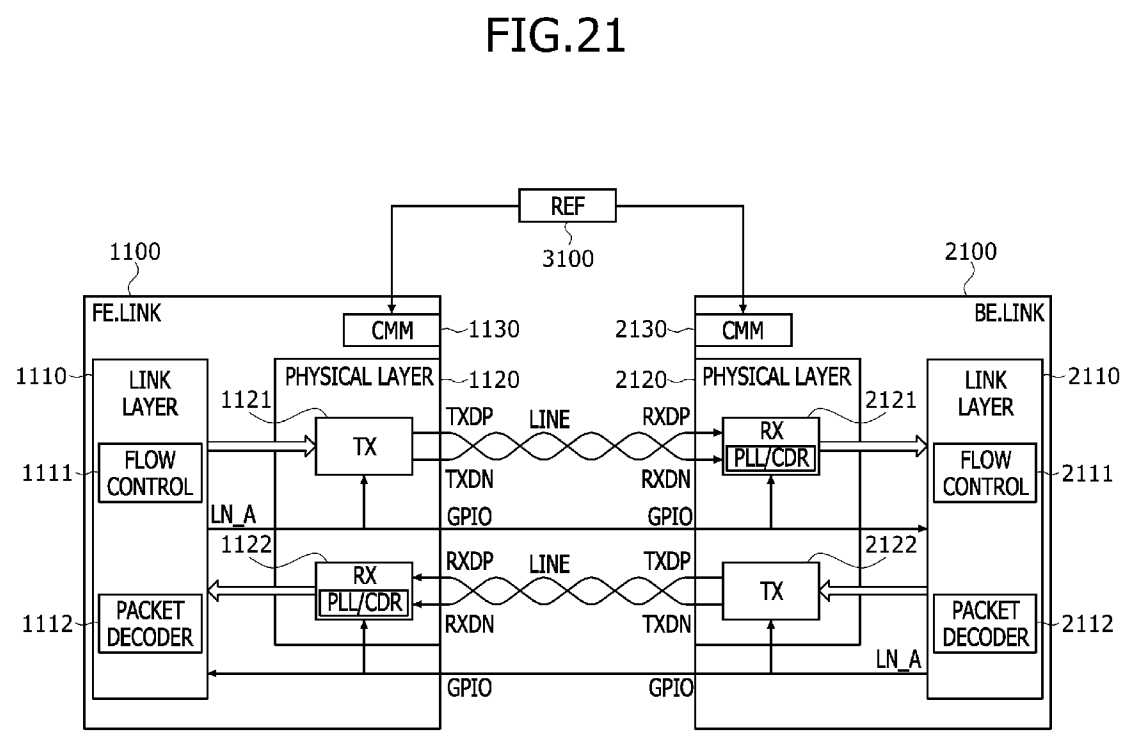

FIG. 21 is a block diagram illustrating configurations of a front-end link and a back-end link of a storage architecture according to an embodiment of the disclosed technology.

Figure 22:
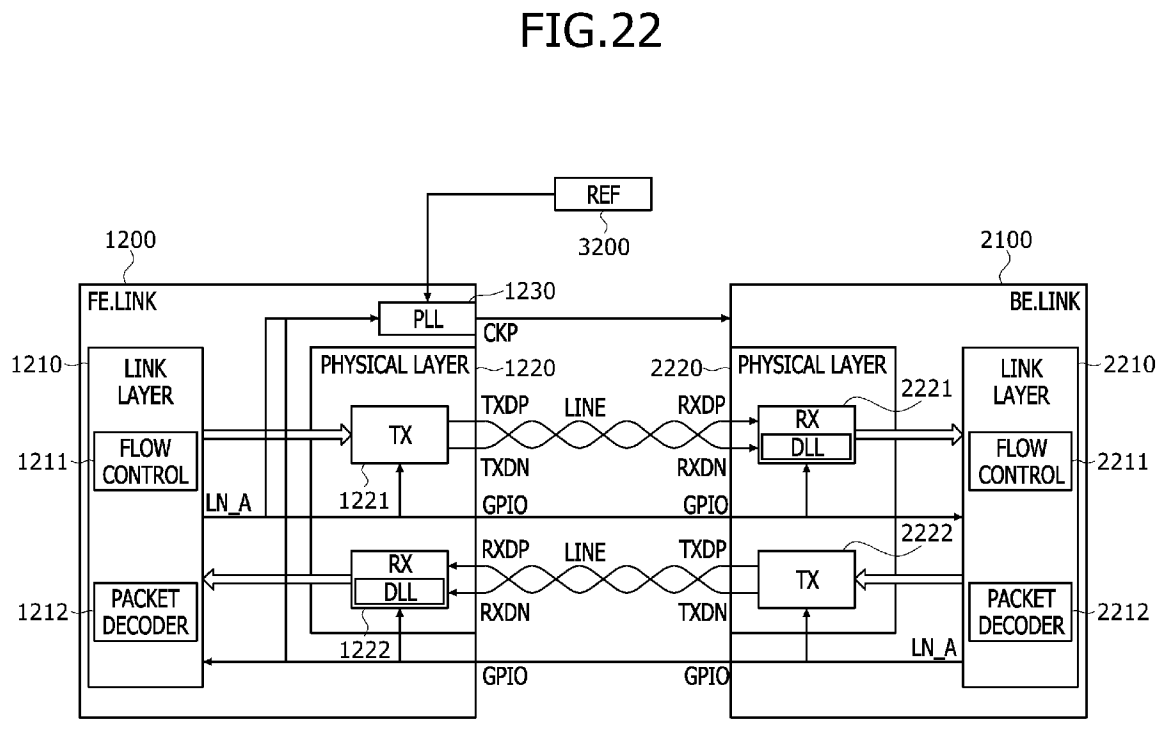

FIG. 22 is a block diagram illustrating configurations of a front-end link and a back-end link of a storage architecture according to another embodiment of the disclosed technology.

Figure 23:
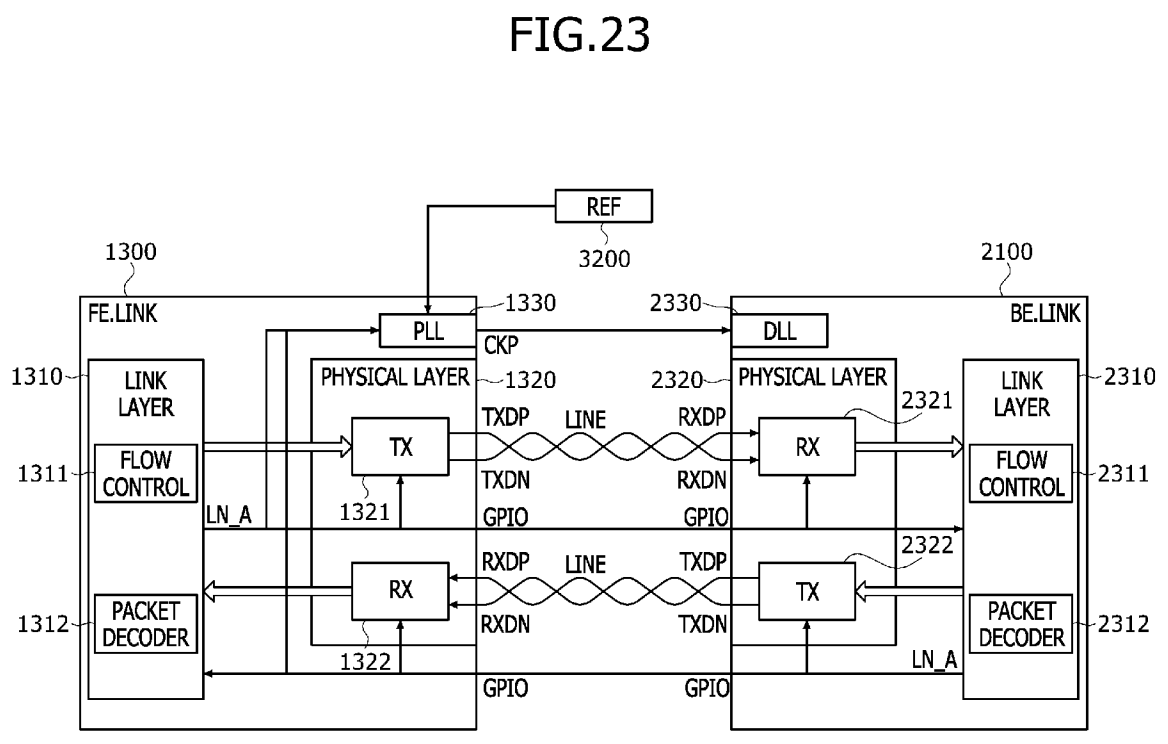

FIG. 23 is a block diagram illustrating configurations of a front-end link and a back-end link of a storage architecture according to yet another embodiment of the disclosed technology.

FIG. 24 is a diagram illustrating an example of packet transmission process in the front-end link and the back-end link of FIGS. 21 to 23.

DETAILED DESCRIPTION OF THE EMBODIMENTS

Data storage systems in various computing or communication applications can include one or more memory devices for storing data and to communicate with one or more host devices to carry out various data storage operations in connection with commands or requests from the host device. Certain flexibilities in such data storage systems are desirable in order to allow the data storage systems to be adaptive to changes in either a host device or changes in memory devices. The technology in this patent document provides a data storage architecture to allow for an interface device or system between a host device and a storage system with one or more memory devices for storing data to implement different chip sets in communications with the host device or a memory device.

Figure 1:
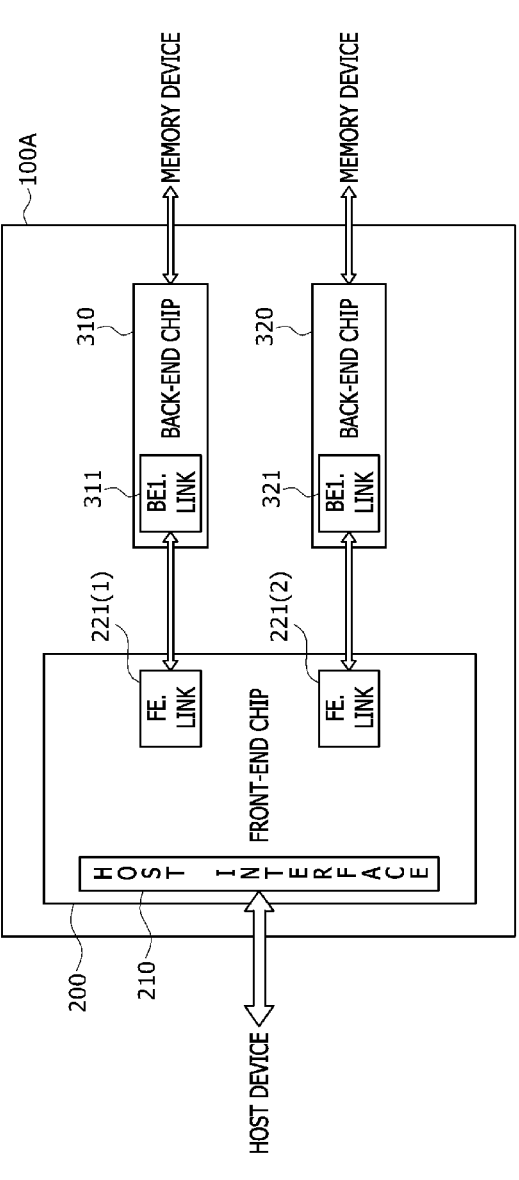
FIG. 1 is a block diagram illustrating a storage architecture according to an embodiment of the disclosed technology.

FIG. 1 is a block diagram illustrating a storage architecture 100A of an interface device or system between a host device and a storage system with one or more memory devices for storing data according to an embodiment of the disclosed technology. The storage architecture 100A may include a front-end chip 200 and a plurality of back-end chips such as two band-end chips 310 and 320 as illustrated. Although the example of the storage architecture 100A in FIG. 1 shows an inclusion of two back-end chips 310 and 320, a greater number of back-end chips may be included in the storage architecture 100A in various implementations. The front-end chip 200 may be disposed between a host device, such as a processor, and the back-end chips 310 and 320. The back-end chips 310 and 320 may be disposed between the front-end chip 200 and memory devices. The front-end chip 200 may communicate with the host device and the back-end chips 310 and 320. The back-end chips 310 and 320 may communicate with the front-end chip 200 and the memory devices that store data.

The front-end chip 200 and the back-end chips 310 and 320 may be configured in a chiplet structure. Thus, the front-end chip 200 and the back-end chips 310 and 320 may have structures that are physically separated from each other and thus function independently of each other, and may transmit data and signals through buses between the chips. As further explained below, the physical separation between the front-end chip 200 and the back-end chips (e.g., 310 and 320) allows the front-end chip 200 to be replaced separately from the back-end chips (e.g., 310 and 320) and the back-end chips (e.g., 310 and 320) to be replaced separately from front-end chip 200. In various implementations, the host device may operate at a faster speed than a memory device that stores data. In such implementations, the front-end chip 200 may be configured to support high-speed communications with the high-speed host device and the back-end chips 310 and 320 may be configured to support low-speed communication with lower-speed memory devices. In various embodiments of the disclosed technology, "high speed" and "low speed" are to indicate a relative speed difference between the host device and memory devices. Due to the differences in speed and performance supported by the front-end chip 200 and the back-end chips 310 and 320, the front-end chip 200 may be manufactured through a relatively fine process, compared to the back-end chips 310 and 320. A memory device in communication with the back-end chip 310 or 320 may be configured to include a volatile memory device, such as a DRAM device, an accelerator memory device that performs an accelerating operation, or a non-volatile memory device, such as a phase change memory (PCM) device or a flash memory device. In some implementations, such a memory device may have a module structure that includes a volatile memory device, an accelerator memory device, and a non-volatile memory device.

The front-end chip 200 may include a host interface 210 for communication with the host device. In addition, the front-end chip 200 may include front-end links (FE. LINKs) 221(1) and 221(2) for communication with the back-end chips 310 and 320, respectively. The back-end chips 310 and 320 may include back-end links (BE1.LINKs) 311 and 321, respectively, for communication with the front-end chip 200. In an example, the host interface 210 of the front-end chip 200 may be configured by employing a peripheral component interconnect express (hereinafter, referred to as "PCIe") protocol. In another example, the host interface 210 may be configured by employing a compute express link (hereinafter, referred to as "CXL") protocol. In some cases, the host interface 210 may be configured by employing both the PCIe protocol and the CXL protocol. The first front-end link 221(1) of the front-end chip 200 may be coupled to the back-end link 311 of the first back-end chip 310. The second front-end link 221(2) of the front-end chip 200 may be coupled to the back-end link 321 of the second back-end chip 320.

When the storage architecture 100A according to the present embodiment is employed in a computing system, in some implementations, only the front-end chip 200 may be replaced with another replacement front-end chip equipped with revised or updated communication protocols with the host device while the back-end chips 310 and 320 are maintained. In some other implementations, only the back-end chips 310 and 320 may be replaced with replacement back-end chips equipped with revised or updated communication protocols with the memory devices while the front-end chip 200 is maintained. In yet other implementations, both the front-end chip 200 and the back-end chips 310 and 320 may be replaced with updated front-end and back-end chips equipped with revised or updated communication protocols with the host and memory devices. In an example, the host device may support the fifth generation standard of the PCIe protocol and the memory devices may support the DDR5 standard DRAM, and accordingly, the front-end chip 200 of the storage architecture 100A may support the PCIe $5^{th}$ generation protocol and the back-end chips 310 and 320 of the storage architecture 100A may support the DDR5 standard DRAM. When a storage architecture has a system on chip (SOC) format, when the interfacing standard of the host device is changed while the DRAM standard is not changed or in the opposite case, the storage architecture itself can be designed to allow for changes to support the changed standard of the host device. The storage architecture 100A according to the present embodiment, when only the interfacing standard of the host device is changed, only the front-end chip 200 may be replaced with a replacement front-end chip that supports the new interfacing standard with the host device. When only the DRAM standard is changed while the host device standard remains unchanged, the storage architecture 100A enables only the back-end chips 310 and 320 to be replaced with updated back-end chips that support the changed DRAM standard while maintaining the current front-end chip in communication with the host device.

Figure 2:
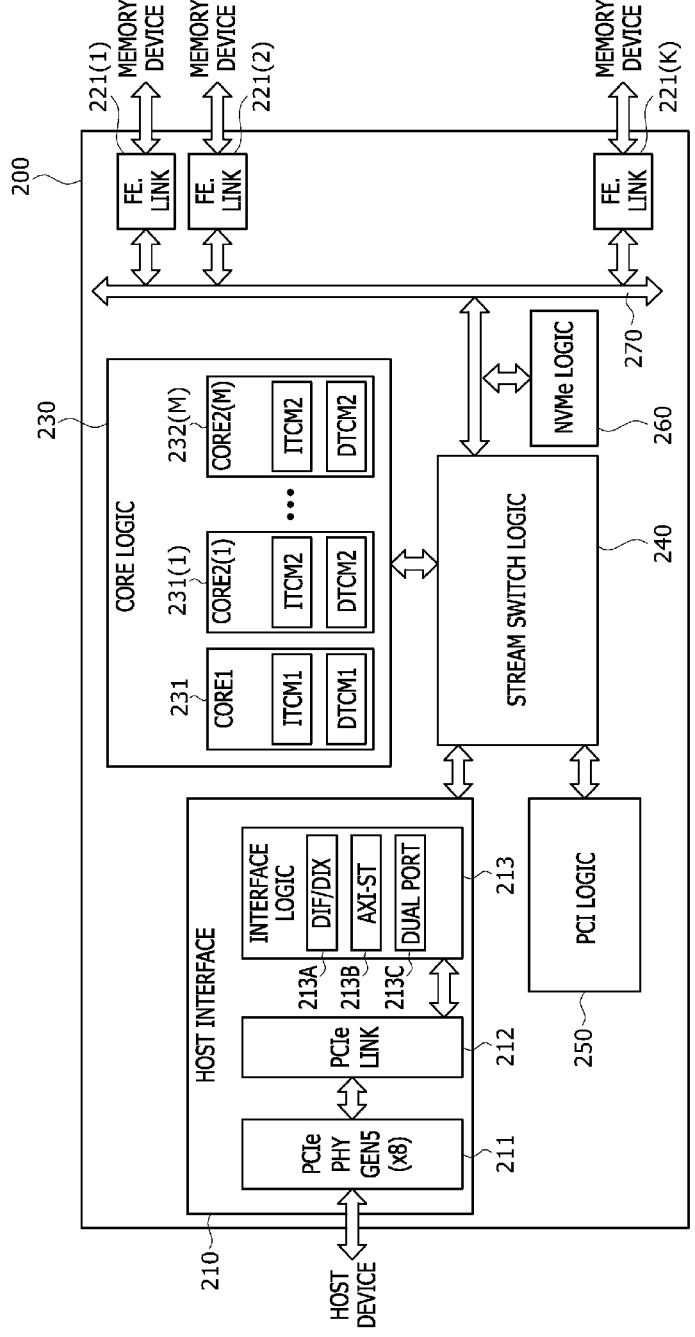
FIG. 2 is a block diagram illustrating an example of a configuration of the front-end chip of the storage architecture of FIG. 1.

FIG. 2 is a block diagram illustrating an example of a configuration of the front-end chip 200 with some examples of various components at a more detailed level for implementing the storage architecture 100A of FIG. 1. In this example, the front-end chip 200 according to the present example communicates with the host device in the PCIe $5^{th}$ generation standard with 8 lanes (x8) for communications. In other implementations, the front-end chip 200 may communicate with the host device using a different communication protocol such as the compute express link (CXL) standard for high speed communications.

Referring to FIG. 2, the front-end chip 200 may include the host interface 210, a plurality of, for example, "K" front-end links (FE.LINKs) 221(1)-221(K) ("K" is a natural number), a core logic circuit 230, a stream switch logic circuit 240, a PCI logic circuit 250, an NVMe (nonvolatile memory express) logic circuit 260, and a link fabric 270. The host interface 210 may include a PCIe physical layer 211, a PCIe link 212, and an interface logic circuit 213. The PCIe physical layer 211 may be a physical layer that is coupled to the host device according to the PCIe $5^{th}$ generation standard. The PCIe physical layer 211 may transmit signals and/or data that are transmitted from the host device to the PCIe link 212 according to the PCIe protocol. In addition, the PCIe physical layer 211 may transmit signals and/or data that are transmitted from the PCIe link 212 to the host device according to the PCIe protocol. The PCIe link 212 may provide a path of signals and data between the PCIe physical layer 211 and the interface logic circuit 213. The PCIe link 212 may transmit signals and/or data that are transmitted from the PCIe physical layer 211 to the interface logic circuit 213. In addition, the PCIe link 212 may transmit signals and/or data that are transmitted from the interface logic 213 to the PCIe physical layer 211.

The interface logic circuit 213 may control signal and data processing in the host interface 210. The interface logic circuit 213 may process the signals and/or data that are transmitted from the PCIe link 212 and may transmit the processed signal and/or data to the stream switch logic circuit 240. In addition, the interface logic circuit 213 may process the signals and/or data that are transmitted from the stream switch logic circuit 240 and may transmit the processed signals and/or data to the PCIe link 212. In an example, the interface logic circuit 213 may include a logic circuit (DIF/DIX) 213A for data integrity. The logic circuit 213A may include extra bytes, such as a data integrity field (DIF) in the data, or may generate data integrity extension (DIX) data that is used to check data integrity. In an example, the interface logic circuit 213 may include a stream control logic circuit for controlling data transmission, for example, an advanced extensible interface (AXI) stream control logic circuit (AXI-ST) 213B. In an example, the interface logic circuit 213 may include a buffer memory circuit (DUAL PORT) 213C for data buffering in the host interface 210.

The first to "K"th front-end links 221(1)-221(K) may be respectively coupled to the memory devices through external buses, as described with reference to FIG. 1. The front-end links 221(1)-221(K) may be coupled to the link fabric 270 through internal buses within the front-end chip 200. The front-end links 221(1)-221(K) may transmit signals and/or data that are transmitted through the link fabric 270 to the memory devices. In addition, the front-end links 221(1)-221(K) may transmit signals and/or data that are transmitted from the memory devices to the link fabric 270.

The core logic circuit 230 may perform a function of processing instructions and data in the front-end chip 200. The core logic circuit 230 may include a plurality of core circuits 231, and 232(1)-232(M). In an example, the core logic circuit 230 may include a first core circuit (CORE1) 231 and a plurality of, for example, "M" second core circuits (CORE2s) 232(1)-232(M) ("M" is a natural number). Although not shown in the FIG. 2, each of the first core circuit 231 and the second core circuits 232(1)-232(M) may include a register file. The first core circuit 230 may include a first instruction tightly-coupled memory (ITCM1) circuit and a first data tightly-coupled memory (DTCM1) circuit and the first core circuit 231 may be coupled to the first instruction tightly-coupled memory (ITCM1) circuit and the first data tightly-coupled memory (DTCM1) circuit through an internal high-speed interface. Each of the second core circuits 232(1)-232(M) may include a second instruction tightly-coupled memory (ITCM2) circuit and a second data tightly-coupled memory (DTCM2) circuit and be coupled to the second instruction tightly-coupled memory (ITCM2) circuit and the second data tightly-coupled memory (DTCM2) circuit through an internal high-speed interface. The first core circuit 231 may be configured to have a faster processing speed than the second core circuits 232(1)-232(M). In an example, the first operation speed of the first core circuit 231 may be in a unit of GHz, and the second operation speed of each of the second core circuits 232(1)-232(M) may be in a unit of Hz. The first instruction tightly-coupled memory (ITCM1) circuit may be configured with a larger storage capacity than the second instruction tightly-coupled memory (ITCM2) circuit. In some implementations, the second data tightly-coupled memory (DTCM2) circuit may have a larger storage capacity than the first data tightly-coupled memory (DTCM1) circuit. In an example, each of the first instruction tightly-coupled memory ITCM1 circuit, the first data tightly-coupled memory DTCM1 circuit, the second instruction tightly-coupled memory ITCM2 circuit, and the second data tightly-coupled memory DTCM2 circuit may be configured with a SRAM circuit. Although not shown in the drawing, the core logic circuit 230 may include a logic circuit for processing sub-commands that are generated by separating commands.

The stream switch logic circuit 240 may control the transmission paths of signals and data in the front-end chip 200. To this end, the stream switch logic circuit 240 may control various internal buses in the front-end chip 200. The stream switch logic circuit 240 may be coupled to other components in the front-end chip 200, that is, the host interface 210, the core logic circuit 230, the PCI logic circuit 250, the NVMe logic circuit 260, and the link fabric 270 through the internal buses.

The PCI logic circuit 250 may provide a means for connecting various peripheral devices of the PCI scheme. In an example, the PCI logic circuit 250 may be configured with a PCI mezzanine card (PMC). The PMC may be configured by combining a common mezzanine card (CMD) and a PCI bus. When connection with peripheral devices of the PCI scheme is not required, the PCI logic circuit 250 may be removed from the front-end chip 200.

The NVMe logic circuit 260 may perform interfacing for non-volatile memory express (NVMe) devices. In an example, the NVMe logic circuit 260 may include a conversion logic circuit that converts a virtual memory circuit into a physical memory circuit. In an example, the NVMe logic circuit 260 may generate a physical region page (PRP) that has physical memory information of the NVMe device on which a command is to be executed. In an example, the NVMe logic circuit 260 may generate a scatter gather list (SGL) that corresponds to a chained list of distributed collection elements.

The link fabric 270 may be disposed between the stream switch logic circuit 240 and the front-end links 221(1)-221(K). The link fabric 270 may act as a transmission path for signals and/or data between the stream switch logic circuit 240 and the front-end links 221(1)-221(K). In an example, the link fabric 270 may be configured as a main bus. Although not shown in FIG. 2, the link fabric 270 may be configured in a structure that provides a route between nodes.

Figure 3:
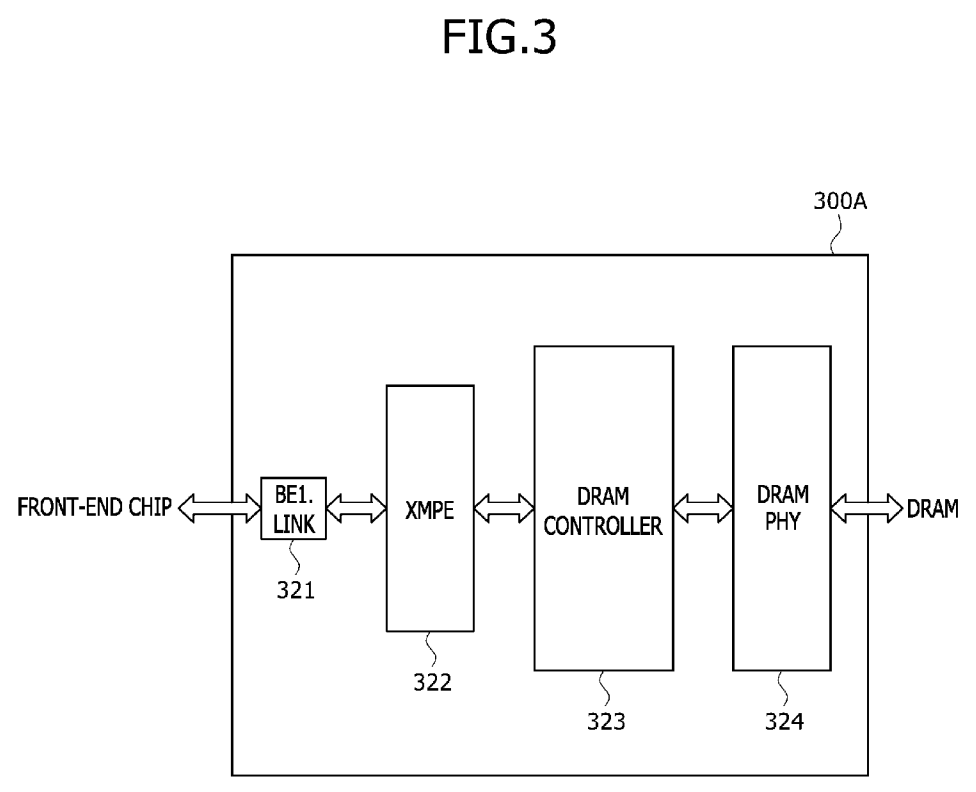

FIG. 3 is a block diagram illustrating an example of a back-end chip 300A that constitutes a storage architecture for a segment of the storage architecture 100A between the front-end chip in communication with the host device and a memory device in FIG. 1 according to an embodiment of the disclosed technology. The description of the back-end chip 300A below may be applied to each of the back-end chips 310 and 320 of the storage architecture 100A of FIG. 1. The back-end chip 300A according to the present example is configured to be coupled to a DRAM device as a memory device in the storage system. The back-end chip 300A may include a back-end link 321, an extreme memory profile (XMP) enhancer (XMPE) 322, a DRAM controller 323, and a DRAM physical layer (DRAM PHY) 324. The back-end link 321 may be coupled to one of the front-end links (221(1)-221(K) of FIG. 2) through an external bus. The XMP enhancer 322 may support the memory profile function of a DRAM device. The DRAM controller 323 may control access operations to the DRAM device, for example, a read operation and a write operation. The DRAM physical layer 324 may perform interfacing with the DRAM device. The DRAM physical layer 324 may communicate with the DRAM device through a bus that has a band width corresponding to the standard of the DRAM device. Although not shown in FIG. 3, the back-end chip 300A according to the present example may constitute one package, together with DRAM devices. In this case, the package may be configured in such a way that the back-end chip 300A is disposed in a first region of the package substrate and DRAM dies are stacked and disposed in a second region of the package substrate.

Figure 4:
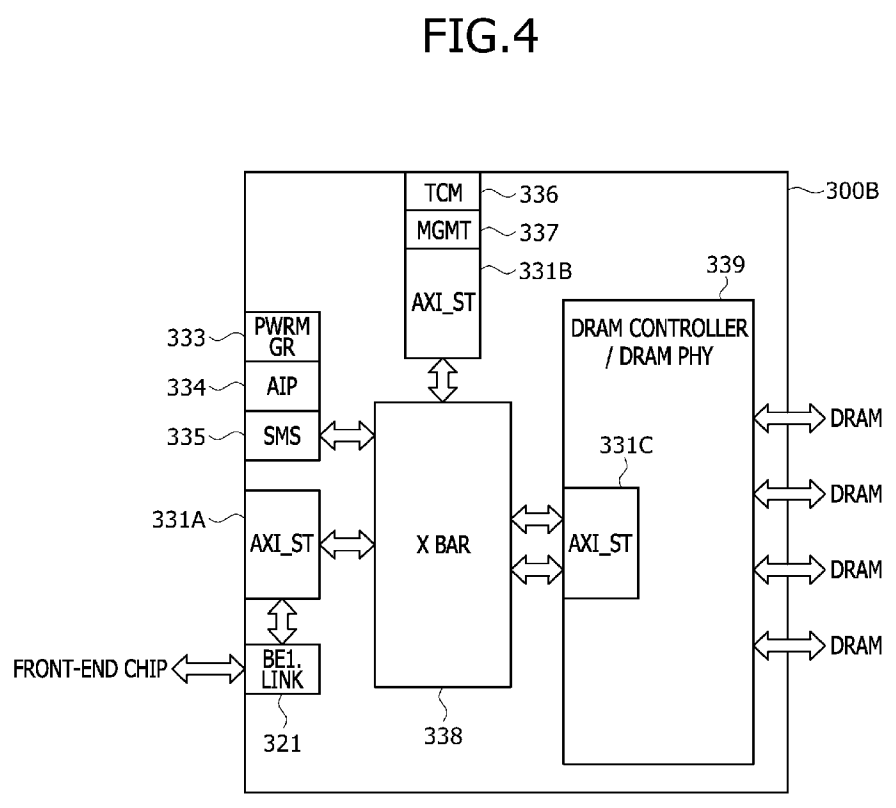

FIG. 4 is a block diagram illustrating another example of a back-end chip 300B that constitutes a storage architecture for a segment of the storage architecture 100A between the front-end chip in communication with the host device and different memory devices in FIG. 1 according to an embodiment of the disclosed technology. The description of the back-end chip 300B below may be applied to each of the back-end chips 310 and 320 of the storage architecture 100A of FIG. 1. In the illustrated example in FIG. 4, the different memory devices coupled to the back-end chip 300B are DRAM devices. As illustrated, the back-end chip 300B may include a back-end link 321, a first AXI stream control logic circuit 331A, a power management logic circuit 333, an embedded application logic circuit 334, a system management service logic circuit 335, a tightly-coupled memory (TCM) circuit 336, a memory management logic circuit 337, a second AXI stream control logic circuit 331B, a cross bar 338, and a DRAM controller/DRAM physical layer 339. The DRAM controller/DRAM physical layer 339 may include a third AXI stream control logic circuit 331C.

The back-end link 321 may be coupled to one of the front-end links (221(1)-221(K) of FIG. 2) of the front-end chip (200 of FIG. 2) through an external bus. The first AXI stream control logic circuit 331A may be coupled to the back-end link 321 through an internal bus. The internal bus that is coupled to the first AXI stream control logic circuit 331A may include a plurality of channels, for example, read channels and write channels. The first AXI stream control logic circuit 331A may provide a data transmission path between the back-end link 321 and the cross bar 338. The power management logic circuit 333 may manage power in the back-end chip 300B. The embedded application logic circuit 334 may perform operations according to programmed embedded applications. The system management service logic circuit 335 may perform a system management service operation in the back-end chip 300B. The system management service logic circuit 335 may be coupled to the cross bar 338 through an internal bus.

The tightly-coupled memory circuit 336 may be used as a buffer memory circuit in the back-end chip 300B. The memory management logic circuit 337 may perform a control operation on the tightly-coupled memory circuit 336. The second AXI stream control logic circuit 331B may be coupled to the cross bar 338 through an internal bus. The second AXI stream control logic circuit 331B may provide a data transmission path between the memory management logic circuit 337 and the cross bar 338. The cross bar 338 may be coupled to the first AXI stream control logic circuit 331A, the second AXI stream control logic circuit 331B, the third AXI stream control logic circuit 331C of the DRAM controller/DRAM physical layer 339, and the system management service logic circuit 335 through internal buses.

The cross bar 338 may be configured to designate various paths of the signals and data that are received through the internal buses. The DRAM controller/DRAM physical layer 339 may be coupled to the cross bar 338 through the third AXI stream control logic circuit 331C. The DRAM controller/DRAM physical layer 339 may be coupled to a plurality of DRAM devices (DRAMs) via external buses.

Figure 5:
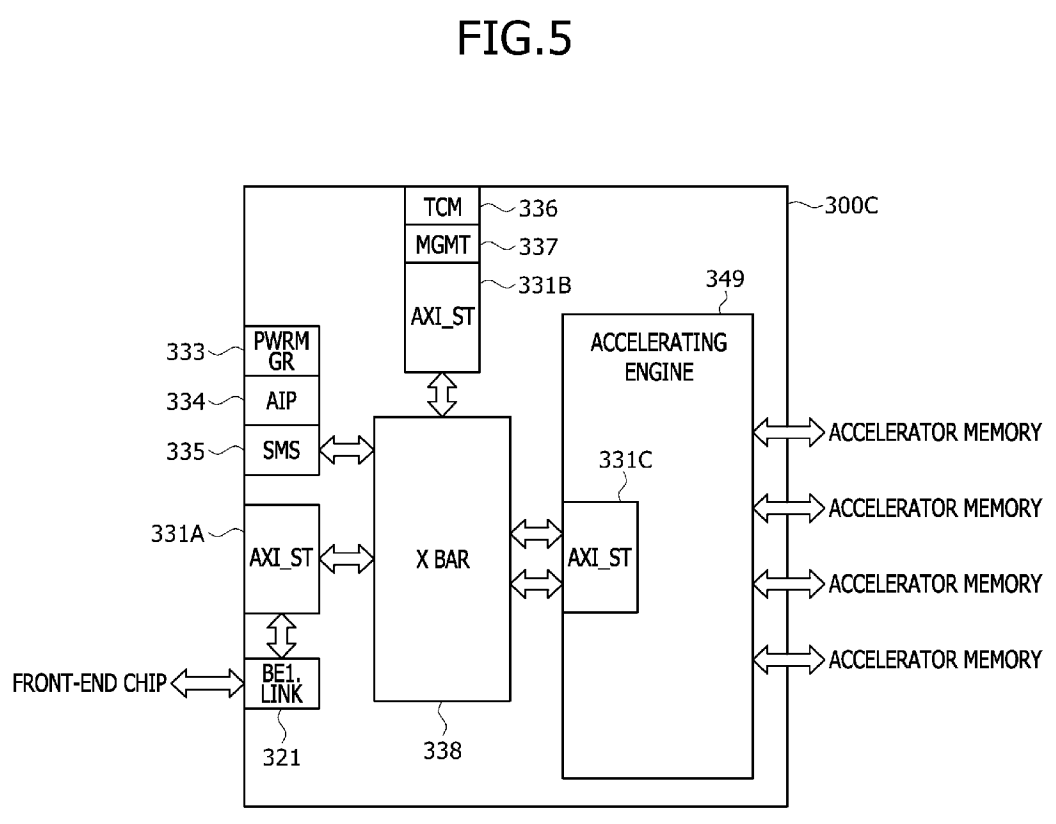

FIG. 5 is a block diagram illustrating a back-end chip 300C that constitutes a storage architecture for a segment of the storage architecture 100A between the front-end chip in communication with the host device and different memory devices in FIG. 1 according to an embodiment of the disclosed technology. The description of the back-end chip 300C below may be applied to each of the back-end chips 310 and 320 of the storage architecture 100A of FIG. 1. The back-end chip 300C according to the present example may be configured to be coupled to a plurality of accelerators. In FIG. 5, the same reference numerals as those of FIG. 4 denote the same components, and thus overlapping descriptions will be omitted. Referring to FIG. 5, the back-end chip 300C may be different from the back-end chip 300B of FIG. 4 in that an accelerating engine 349 is employed instead of the DRAM controller/DRAM physical layer (339 in FIG. 4). The accelerating engine 349 may be coupled to the cross bar 338 through the third AXI stream control logic circuit 331C and an internal bus in the back-end chip 300C. The accelerating engine 349 may be coupled to a plurality of accelerator memory devices through external buses. The accelerator memory device may have a form in which a memory device and an operating processor are configured in a single chip. Accordingly, the accelerating engine 329 may control the arithmetic operation and the memory operation of the accelerator memory device.

Figure 6:
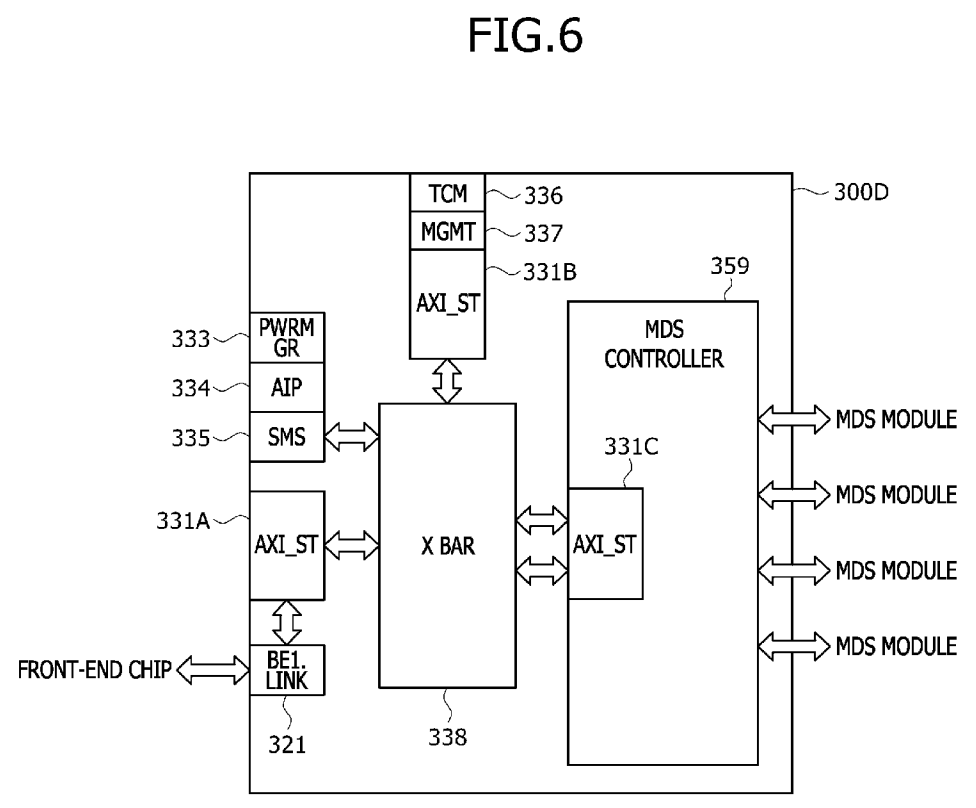

FIG. 6 is a block diagram illustrating a back-end chip 300D that constitutes a storage architecture according to an embodiment of the disclosed technology. The description of the back-end chip 300D below may be applied to each of the back-end chips 310 and 320 of the storage architecture 100A of FIG. 1. The back-end chip 300D according to the present example may be configured to be coupled to a plurality of managed DRAM solution (MDS) modules. In FIG. 6, the same reference numerals as those of FIGS. 4 and 5 denote the same components, and thus overlapping descriptions will be omitted. Referring to FIG. 6, the back-end chip 300D may be different from the back-end chip 300C of FIG. 5 in that an MDS controller 359 is employed instead of the DRAM controller/DRAM physical layer (339 in FIG. 4) and the accelerating engine (349 in FIG. 5). The MDS controller 359 may be coupled to the cross bar 338 through the third AXI stream control logic circuit 331C and the internal bus in the back-end chip 300D. The MDS controller 359 may be coupled to the MDS modules through external buses. The MDS controller 359 may control the access operations to the MDS modules.

Figure 7:
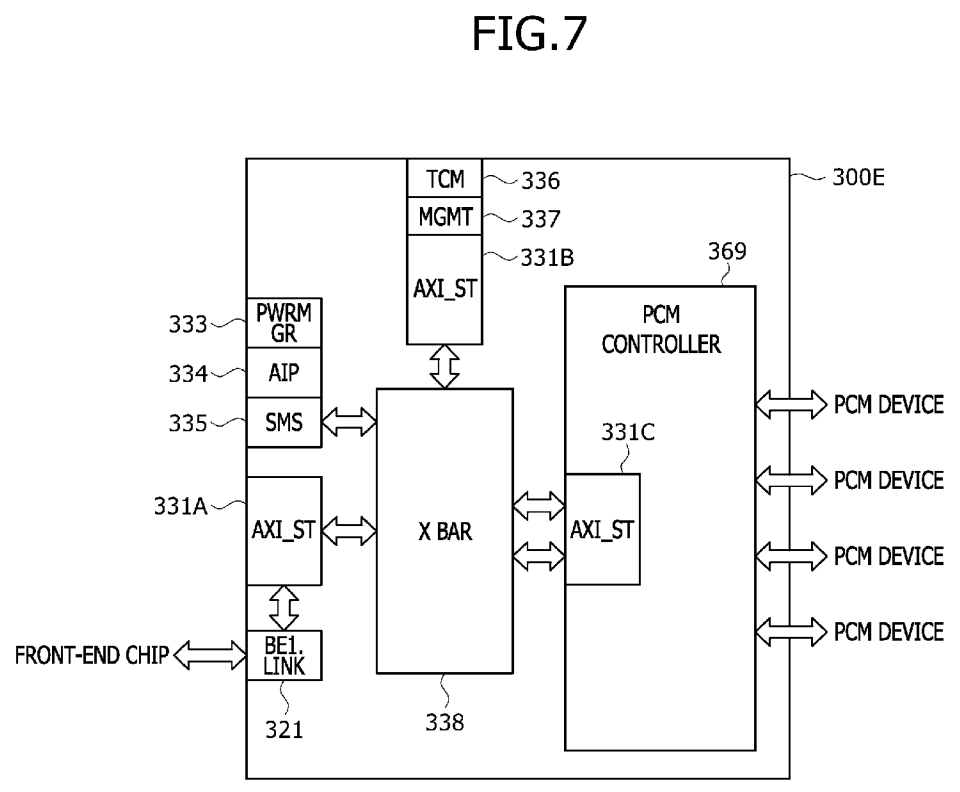

FIG. 7 is a block diagram illustrating a back-end chip 300E that constitutes a storage architecture according to an embodiment of the disclosed technology. The description of the back-end chip 300E below may be applied to each of the back-end chips 310 and 320 of the storage architecture 100A of FIG. 1. The back-end chip 300E according to the present example may be configured to be coupled to a plurality of PCM devices. In FIG. 7, the same reference numerals as those of FIGS. 4 to 6 denote the same components, and thus overlapping descriptions will be omitted. Referring to FIG. 7, the back-end chip 300E may be different from the back-end chip 300B of FIG. 4, the back-end chip 300C of FIG. 5, and the back-end chip 300D of FIG. 6 in that a PCM controller 369 is employed instead of the DRAM controller/DRAM physical layer (339 of FIG. 4), the accelerating engine (349 of FIG. 5), and the MDS controller (359 in FIG. 6). The PCM controller 369 may be coupled to the cross bar 338 through the third AXI stream control logic circuit 331C and an internal bus. The PCM controller 369 may be coupled to the PCM devices through external buses. The PCM controller 369 may control the access operations to the PCM devices.

Figure 8:
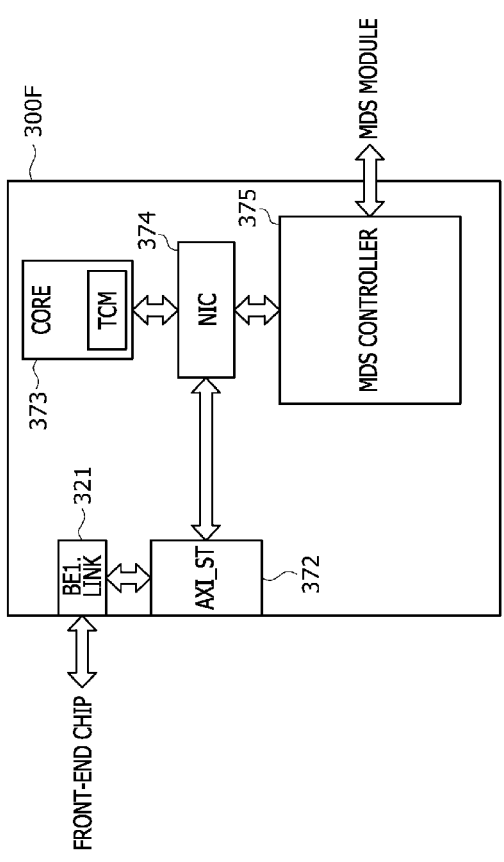
FIG. 8 is a block diagram illustrating a back-end chip that constitutes a storage architecture according to yet another embodiment of the disclosed technology.

FIG. 8 is a block diagram illustrating a back-end chip 300F that constitutes a storage architecture according to an embodiment of the disclosed technology. The description of the back-end chip 300F below may be applied to each of the back-end chips 310 and 320 of the storage architecture 100A of FIG. 1. The back-end chip 300F according to the present example may be configured to be coupled to a MDS module. Referring to FIG. 8, the back-end chip 300F may include a back-end link 321, an AXI stream control logic circuit 372, a core circuit 373, a network connection logic circuit (NIC) 374, and an MDS controller 375. The back-end link 321 may be coupled to one of the front-end links (221(1)-221(K) of FIG. 2) of the front-end chip (200 of FIG. 2) through an external bus. The AXI stream control logic circuit 372 may be coupled to the back-end link 321 and the network connecting logic circuit 374 through internal buses. The AXI stream control logic circuit 372 may provide a data transmission path between the back-end link 321 and the network connection logic circuit 374. The core circuit 373 may perform a function of processing instructions and data within the back-end chip 300F. The core circuit 373 may include a tightly-coupled memory TCM circuit. The network connecting logic circuit 374 may be coupled to the AXI stream control logic circuit 372, the core circuit 373, and the MDS controller 375 through internal buses. The network connecting logic circuit 374 may control the signal and data transmission between the AXI stream control logic circuit 372, the core circuit 373, and the MDS controller 375. The MDS controller 375 may be coupled to the MDS module through an external bus. The MDS controller 375 may control the access operation to the MDS module.

Figure 9:
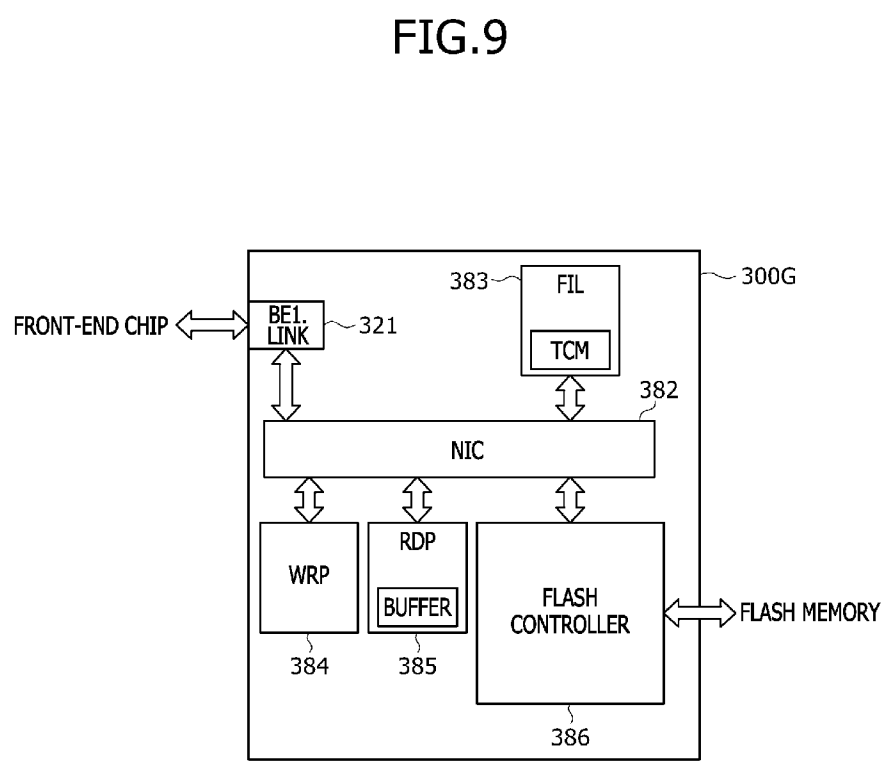

FIG. 9 is a block diagram illustrating a back-end chip 300G that constitutes a storage architecture according to an embodiment of the disclosed technology. The description of the back-end chip 300G below may be applied to each of the back-end chips 310 and 320 of the storage architecture 100A of FIG. 1. The back-end chip 300G according to the present example may be configured to be coupled to a flash memory device. Referring to FIG. 9, the back-end chip 300G may include a back-end link 321, a network connecting logic circuit (NIC) 382, a flash interface layer (FIL) 383, a write protection logic circuit (WRP) 384, a read protection logic circuit (RDP) 385, a flash controller 386. The back-end link 321 may be coupled to one of the front-end links (221(1)-221(K) of FIG. 2) of the front-end chip (200 of FIG. 2) through an external bus. The back-end link 321 may be coupled to the network connecting logic circuit 382 through an internal bus. The network connecting logic circuit 382 may control the data transmission in the back-end chip 300G. The flash interface layer 383 may perform an interfacing operation during read and write operations of the flash memory device. The flash interface layer 383 may include a tightly-coupled memory (TCM) circuit for a buffer memory circuit. The write protection logic circuit (WRP) 384 may perform a function of protecting against unwanted write operations in the flash memory device. The read protection logic circuit (RDP) 385 may perform a function of protecting software code stored in the flash memory device. The flash controller 386 may control access operations to the flash memory device.

Figure 10:
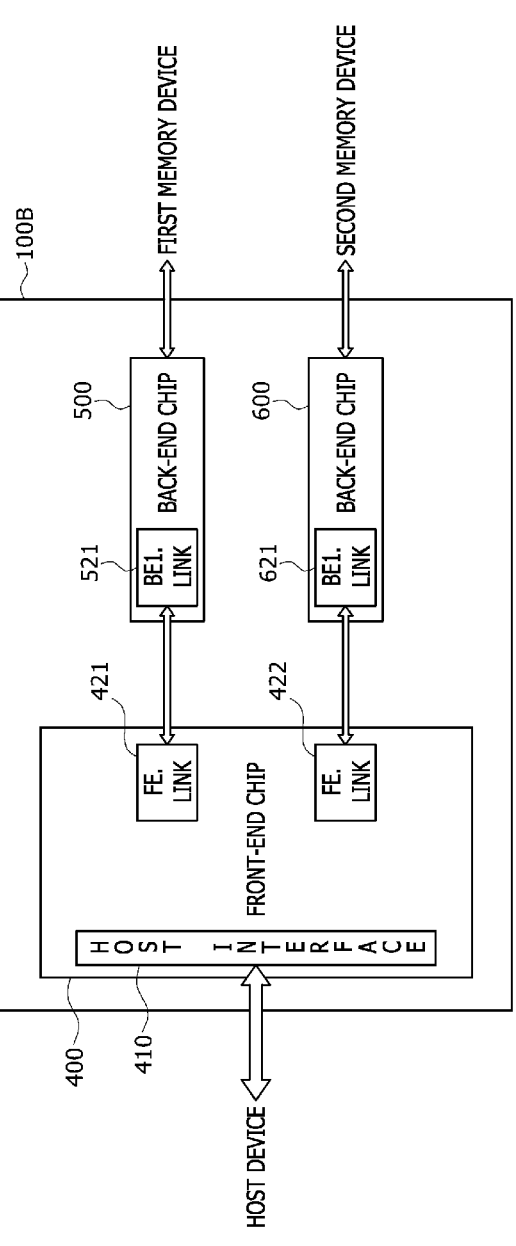
FIG. 10 is a block diagram illustrating a storage architecture according to another embodiment of the disclosed technology.

FIG. 10 is a block diagram illustrating a storage architecture 100B of an interface device or system between a host device and a storage system with one or more memory devices for storing data according to another embodiment of the disclosed technology. Referring to FIG. 10, the storage architecture 100B may include a front-end chip 400, and a plurality of, for example, first and second back-end chips 500 and 600 in which those chips are implemented as separate chips to allow for replacement of any one of them without replacing other chips. Although the storage architecture 100B in FIG. 10 includes two back-end chips 500 and 600, this is only an example, and a larger number of back-end chips may be included in the storage architecture 100B. The front-end chip 400 may be disposed between a host device, for example, a processor, and the first and second back-end chips 500 and 600. The first back-end chip 500 may be disposed between the front-end chip 400 and a first memory device. The second back-end chip 600 may be disposed between the front-end chip 400 and a second memory device. Accordingly, the front-end chip 400 may communicate with the host device and the first and second back-end chips 500 and 600. The first back-end chip 500 may communicate with the front-end chip 400 and the first memory device. The second back-end chip 600 may communicate with the front-end chip 400 and the second memory device.

The front-end chip 400, the first back-end chip 500, and the second back-end chip 600 may be configured in a chiplet structure. That is, each of the front-end chip 400, the first back-end chip 500, and the second back-end chip 600 may have a physically separated chip structure to function independently of each other, and may transmit data and signals through buses between the chips. In general, a host device operates at a faster speed than a memory device. Accordingly, the front-end chip 400 may be configured to support high-speed communication with the host device. On the other hand, the first back-end chip 500 and the second back-end chip 600 may be configured to support low-speed communication with the first memory device and the second memory device, respectively. Due to the difference in processing speeds and performances supported by the front-end chip 400 and the first and second back-end chips 500 and 600, the front-end chip 400 may be manufactured through a relatively finer process, compared to the first and second back-end chips 500 and 600. The speeds supported by the first back-end chip 500 and the second back-end chip 600 may be different from each other according to a difference in speed standards of the first memory device and the second memory device. In an example, the first memory device may be a volatile memory device, such as a DRAM device or an accelerator memory device, and the second memory device may be a non-volatile memory device, such as a flash memory device.

The front-end chip 400 may include a host interface 410 for communication with the host device. In addition, the front-end chip 400 may include a first front-end link (FE-.LINK) 421 for communication with the first back-end chip 500, and may include a second front-end link (FE.LINK) 422 for communication with the second back-end chip 600. The first front-end link 421 and the second front-end link 422 may have the same structure. The first back-end chip 500 may include a first back-end link (BE1.LINK) 521 for communication with the front-end chip 400. The second back-end chip 600 may include a second back-end link (BE1.LINK) 621 for communication with the front-end chip

400. The first back-end link 521 and the second back-end link 621 may have the same structure. In an example, the host interface 410 of the front-end chip 400 may be configured by employing a PCIe protocol and/or a CXL protocol. The first front-end link 421 of the front-end chip 400 may be coupled to the first back-end link 521 of the first back-end chip 500. The second front-end link 422 of the front-end chip 400 may be coupled to the second back-end link 621 of the second back-end chip 600.

When the storage architecture 100B according to the present embodiment is employed in a computing system, only the front-end chip 400 may be replaced while the first and second back-end chips 500 and 600 are maintained. Alternatively, only the second back-end chip 600 may be replaced while the front-end chip 400 and the first back-end chip 500 are maintained. Alternatively, only the first back-end chip 500 may be replaced while the front-end chip 400 and the second back-end chip 600 are maintained. In an example in which the host device supports the $5^{th}$ generation standard of the PCIe protocol and the first memory device is a DDR5 standard DRAM device, the front-end chip 400 of the storage architecture 100B may support the PCIe $5^{th}$ generation protocol and the first back-end chip 500 of the storage architecture 100B may support the DDR5 standard DRAM device. Under such conditions, when the interfacing standard of the host device is changed from, for example, the PCIe $5^{th}$ generation to the PCIe $6^{th}$ generation, only the front-end chip 400 may be replaced with a front-end chip that supports the PCIe $6^{th}$ generation standard. Similarly, when the standard of the DRAM device is changed from the DDR5 to the DDR6, only the first back-end chip 500 may be replaced with a first back-end chip that supports the DDR6 standard.

Figure 11:
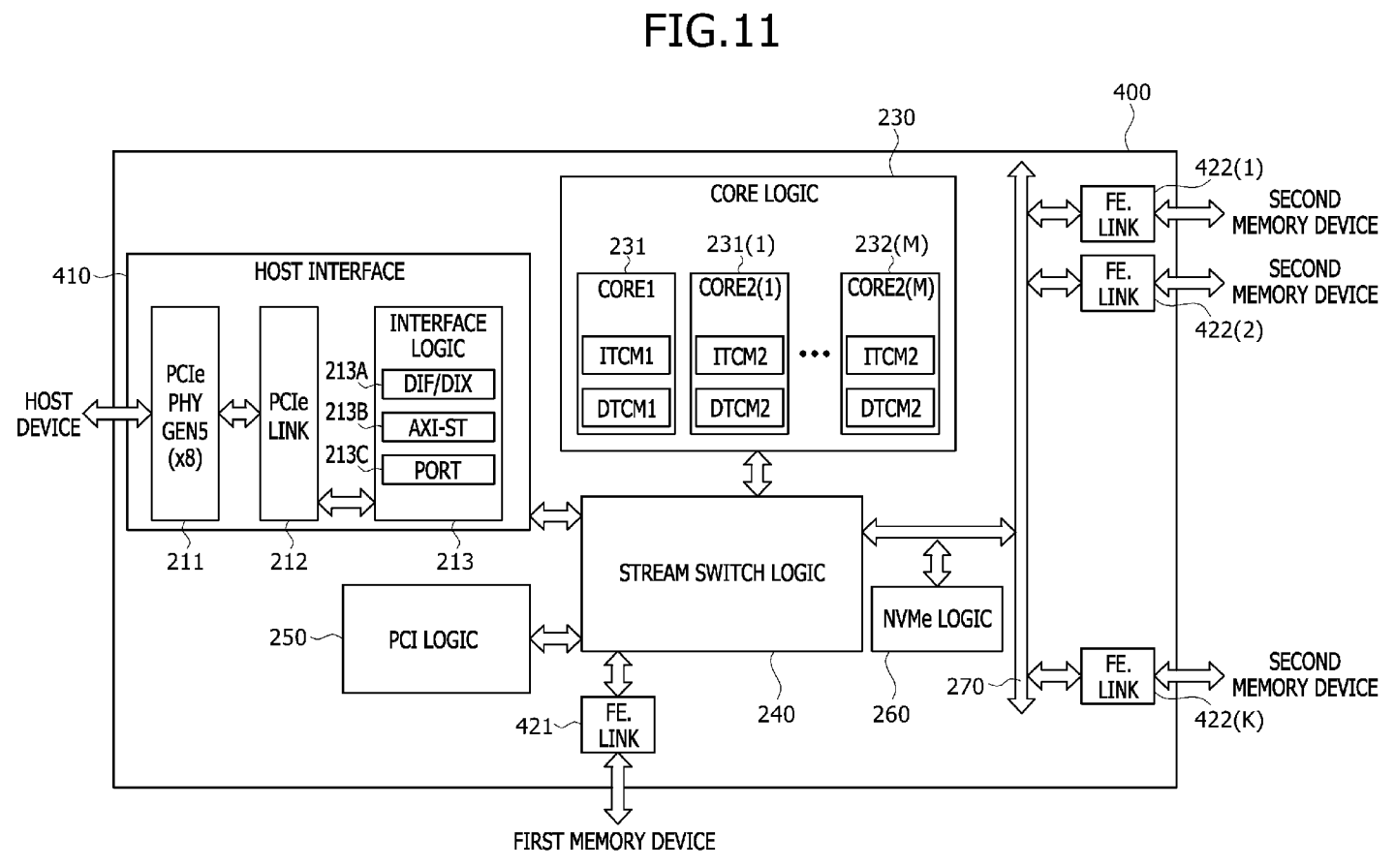

FIG. 11 is a block diagram illustrating an example of a configuration of the front-end chip 400 of the storage architecture 100B of FIG. 10. It is assumed that the front-end chip 400 according to the present example communicates with the host device in the PCIe $5^{th}$ generation (composed of 8 lanes (×8)) standard. However, this is only an example, and the front-end chip 400 may communicate with the host device in the CXL standard. In FIG. 11, the same reference numerals as those of FIG. 2 denote the same components, and repeated descriptions will be omitted below. Referring to FIG. 11, the front-end chip 400 may include a host interface 410, a first front-end link (FE. LINK) 421, a core logic circuit 230, a stream switch logic circuit 240, a PCI logic circuit 250, an NVMe logic circuit 260, a link fabric 270, at least one or more, for example, "K" second front-end links (FE. LINKs) 422(1)-422(K) ("K" is a natural number). The host interface 410 may have the same configuration as the host interface 210 of FIG. 2. The front-end chip 400 according to the present example may be different from the front-end chip (200 of FIG. 2) in which all of the front-end links (221(1)-221(K) in FIG. 2) are coupled to the link fabric 270 in that the first front-end link 421 is coupled to the stream switch logic circuit 240 through an internal bus, and only the second front-end links 422(1)-422(K) are coupled to the link fabric 270.

The first front-end link 421 may be coupled to a first memory device through an external bus, as described with reference to FIG. 10. The first front-end link 421 may be coupled to the stream switch logic circuit 240 through an internal bus in the front-end chip 400. The first front-end link 421 may transmit the signals and/or data that are transmitted through the stream switch logic circuit 240 to the first memory device. In addition, the first front-end link 421 may transmit the signals and/or data that are transmitted from the first memory device to the stream switch logic circuit 240. The second front-end links 422(1)-422(K) may be respectively coupled to second memory devices through external buses, as described with reference to FIG. 11. The second front-end links 422(1)-422(K) may be coupled to the link fabric 270 through an internal bus in the front-end chip 400. The second front-end links 422(1)-422(K) may transmit the signals and/or data that are transmitted from the stream switch logic circuit 240 and the NVMe logic circuit 260 to the second memory devices through the link fabric 270. In addition, the second front-end links 422(1)-422(K) may transmit the signals and/or data that are transmitted from the second memory devices to the stream switch logic circuit 240 and the NVMe logic circuit 260 through the link fabric 270.

Figure 12:
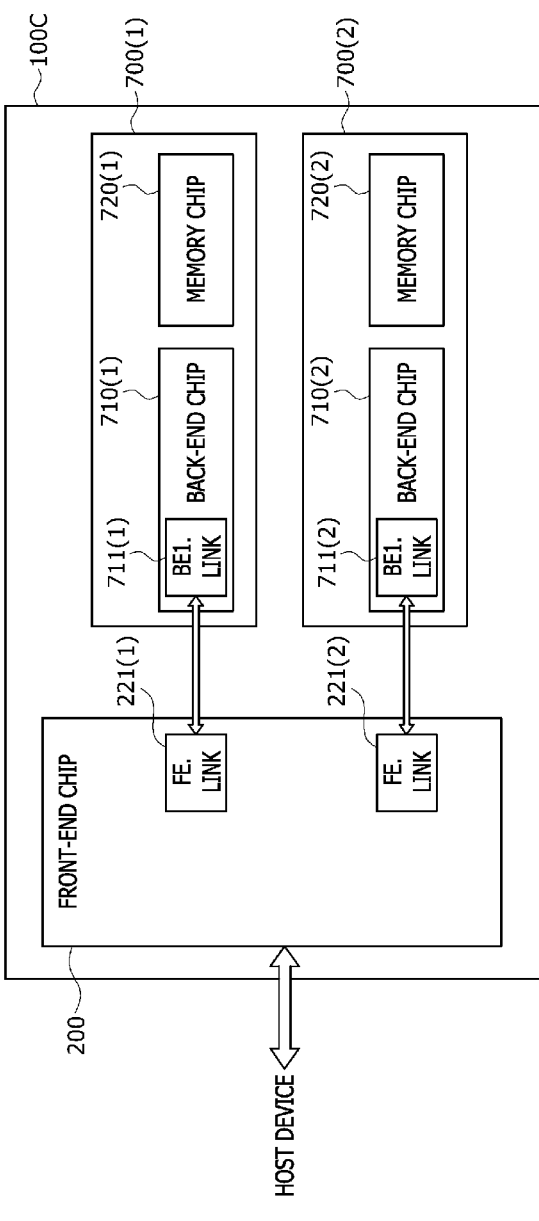
FIG. 12 is a block diagram illustrating a storage architecture according to yet another embodiment of the disclosed technology.

FIG. 12 is a block diagram illustrating a storage architecture 100C according to yet another embodiment of the disclosed technology. Referring to FIG. 12, the storage architecture 100C according to the present embodiment may include a front-end chip 200, and a plurality of, for example, first and second back-end packages 700(1) and 700(2). Although the storage architecture 100C in this embodiment includes two back-end packages 700(1) and 700(2), this is only an example, and the storage architecture 100C may include more than two back-end packages. The front-end chip 200 may have the same configuration as the front-end chip 200 that constitutes the storage architecture 100A described with reference to FIG. 1. Accordingly, the front-end chip 200 may be configured with the elements that are described with reference to FIG. 2. The first and second back-end packages 700(1) and 700(2) may be respectively coupled to the front-end links 221(1) and 221(2) of the front-end chip 200. The first back-end package 700(1) may have a package structure that includes a first back-end chip 710(1) and a first memory chip 720(1). The first back-end package 700(1) may include a first back-end link 711(1) that is coupled to the first front-end link 221(1) of the front-end chip 200. The second back-end package 700(2) may have a package structure that includes a second back-end chip 710(2) and a second memory chip 720(2). The second back-end package 700(2) may include a second back-end link 711(2) that is coupled to the second front-end link 221(2) of the front-end chip 200. The first back-end chip 710(1) and the second back-end chip 710(2) may have the same configuration as one of the back-end chips 310 and 320 described with reference to FIG. 1. Accordingly, various examples of the back-end chip that are described with reference to FIGS. 3 to 9 may be applied to the first back-end chip 710(1) and the second back-end chip 710(2).

Figure 13:
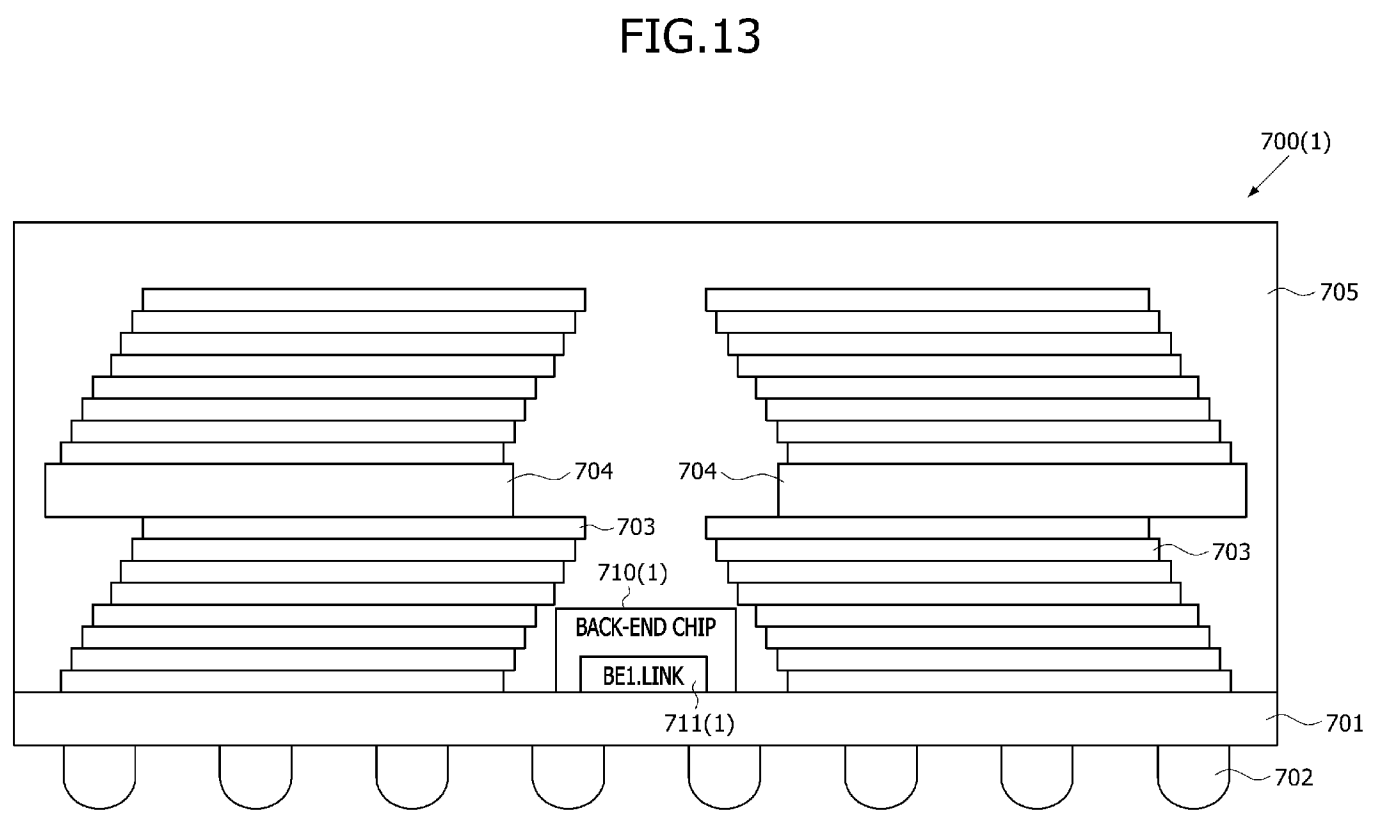

FIG. 13 is a cross-sectional diagram illustrating an example of a configuration of the first back-end package 700(1) of the storage architecture 100C of FIG. 12. The configuration of the first back-end package 700(1) according to the present example may be equally applied to the second back-end package 700(2). Referring to FIG. 13, the first back-end package 700(1) may include a package substrate 701, the first back-end chip 710(1) disposed on a first surface, for example, the upper surface of the package substrate 701, a plurality of memory chips 703 disposed over the upper surface of the package substrate 701, and a molding material 705 that surrounds the first back-end chip 710(1) and the plurality of memory chips 703. A plurality of connection structures 702 may be disposed on a second surface, for example, the lower surface of the package substrate 701. In an example, the plurality of connection structures 702 may be solder balls. The connection structures 702 of the first back-end package 700(1) may be electrically coupled to the first front-end link 221(1) of the front-end chip (200 of FIG. 12). The first back-end chip 710(1) may be disposed in a first region, for example, in the central region of the package substrate 701. The first back-end chip 710(1) may include the first back-end link 711(1). The first back-end link 711(1) may be electrically coupled to the first front-end link 221(1) of the first front-end chip (200 of FIG. 12) through the connection structures 702. The plurality of memory chips 703 may be disposed in the second region, for example, a side region of the package substrate 701. The plurality of memory chips 703 may be stacked in a step shape. As illustrated in FIG. 13, eight memory chips 703 may be stacked on the left region of the package substrate 701, and eight memory chips 703 may be stacked with an intermediate substrate 704 interposed therebetween. Similarly, eight memory chips 703 may be stacked on the right region of the package substrate 701, and eight memory chips 703 may be stacked with an intermediate substrate 704 interposed therebetween. Although not shown in FIG. 13, the first back-end chip 710(1) may be electrically connected to the package substrate 701 through wires or bumps. In addition, the plurality of memory chips 703 may be electrically connected to the package substrate 701 through wires.

Figure 14:
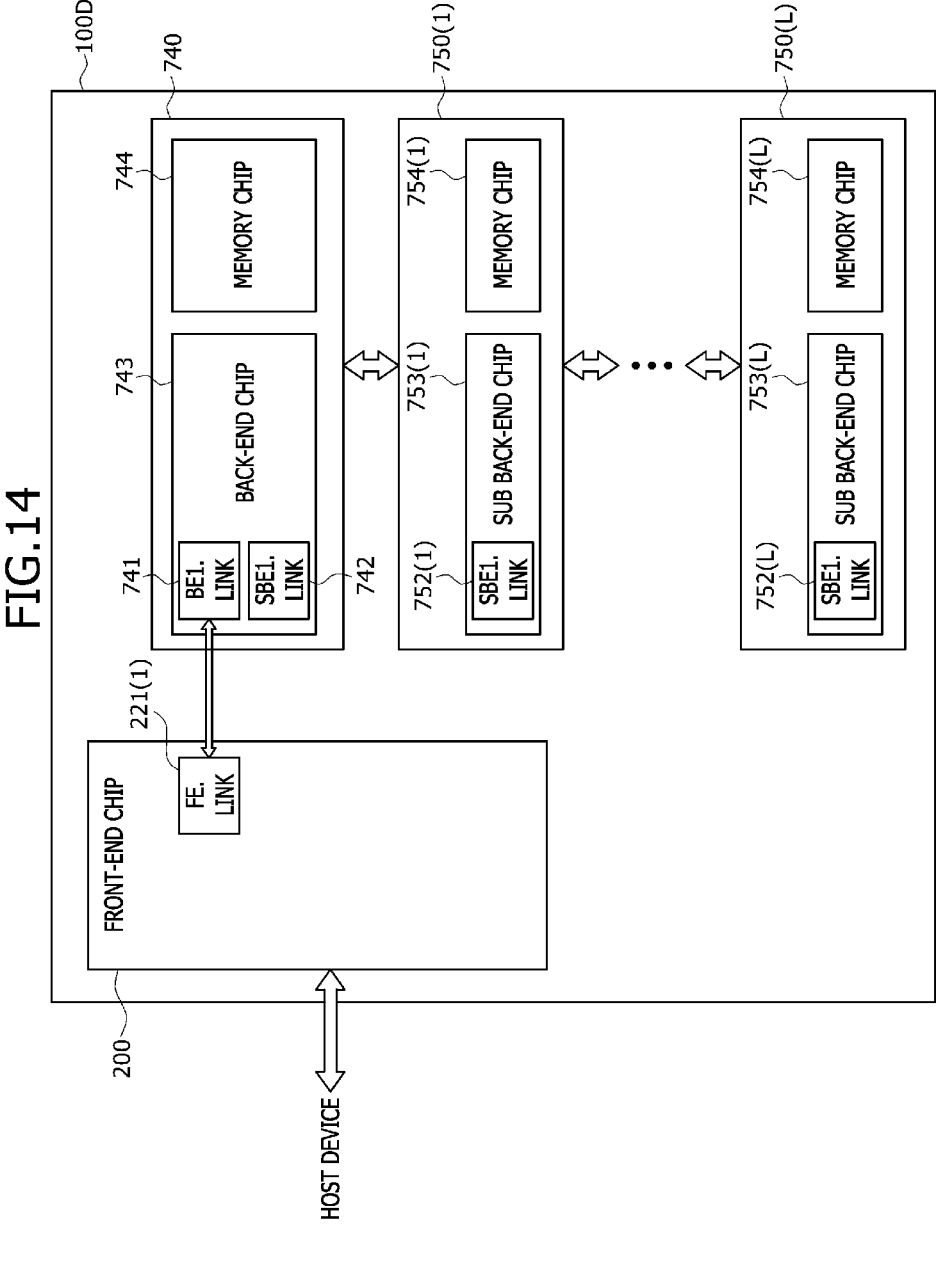
FIG. 14 is a block diagram illustrating a storage architecture according to yet another embodiment of the disclosed technology.
Figure 15:
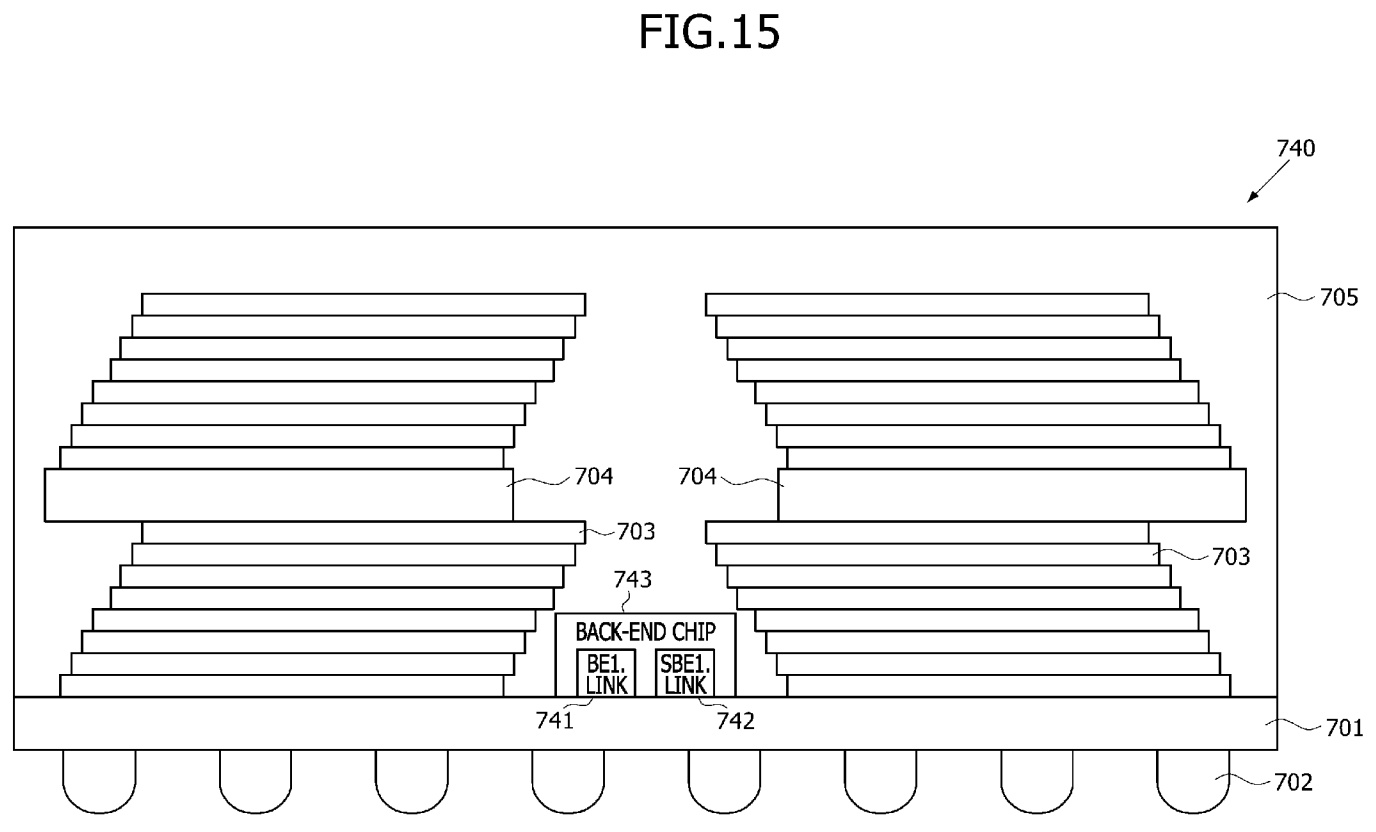
Figure 16:
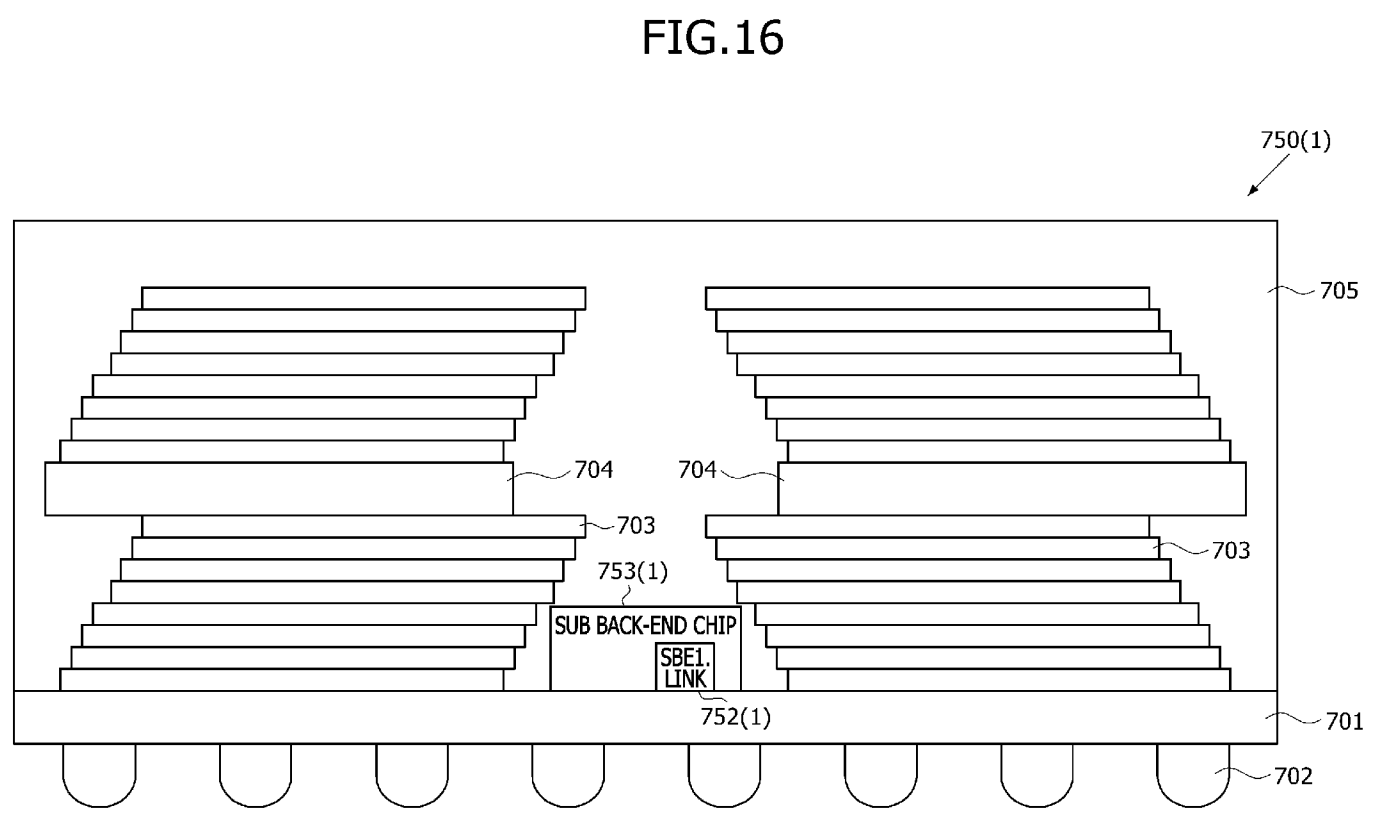

FIG. 14 is a block diagram illustrating a storage architecture 100D according to yet another embodiment of the disclosed technology. FIG. 15 is a cross-sectional diagram illustrating an example of the configuration of a first back-end package 740 of the storage architecture 100D of FIG. 14. In addition, FIG. 16 is a cross-sectional diagram illustrating an example of a first sub back-end package 750(1) of the storage architecture 100D of FIG. 14. In FIGS. 15 and 16, the same reference numerals as those of FIG. 13 denote the same components, and repeated descriptions will be omitted below. First, referring to FIG. 14, the storage architecture 100D according to the present embodiment may include a front-end chip 200, a back-end package 740, and a plurality of, for example, first to "L"th sub back-end packages 750(1)-750(L) ("L" is a natural number). The front-end chip 200 may have the same configuration as the front-end chip 200 that constitutes the storage architecture 100A described with reference to FIG. 1. Accordingly, the front-end chip 200 may be configured with the elements described with reference to FIG. 2. The back-end package 740 may have the same configuration as the first back-end package 700(1) described with reference to FIGS. 12 and 13, except that the back-end package 740 further includes a sub back-end link 742. The back-end package 740 may be coupled to the first front-end link 221(1) of the front-end chip 200 through a back-end link 741. The back-end package 740 may be coupled to the first sub back-end package 750(1) through the sub back-end link 742. As shown in FIG. 15, the back-end package 740 may include a back-end chip 743 that is disposed in a first region, for example, the central region of a package substrate 701. Although not shown in FIGS. 14 and 15, the back-end chip 743 may be electrically coupled to an internal wiring of the package substrate 701 through a bump, and may be electrically coupled to connection structures 702 through the internal wiring of the package substrate 701. That is, the back-end link 741 of the back-end chip 743 may be electrically coupled to the connection structures 702 through the bump and the package substrate 701. Similarly, the sub back-end link 742 of the back-end chip 743 may also be electrically coupled to the connection structures 702 through the bump and package substrate 701.

The first to "L"th sub back-end packages 750(1)-750(L) may be configured in the same way as each other. The first sub back-end package 750(1) may include a sub back-end chip 753(1) and a memory chip 754(1). Similarly, the "L"th sub back-end package 750(L) may include a sub back-end chip 753(L) and a memory chip 754(L). As shown in FIG. 16, the first sub back-end package 750(1) may include a sub back-end chip 753(1) that is disposed in the first region, for example, the central region of the package substrate 701. The sub back-end chip 753(1) may be different from the back-end chip 743 that constitutes the back-end package 740 in that the sub back-end chip 753(1) does not include a back-end link. Although not shown in the drawings, the sub back-end chip 753(1) may be electrically coupled to an internal wiring of the package substrate 701 through a bump, and may be electrically coupled to the connection structures 702 through an internal wiring. That is, the sub back-end link 752(1) may be electrically coupled to the connection structures 702 through the bump and the package substrate 701. The sub back-end packages 750(1)-750(L) might not directly coupled to the first front-end link 221(1) of the front-end chip 200, but may be indirectly coupled to the first front-end link 221(1) of the front-end chip 200 through the back-end package 740. The sub back-end link 752(1) of the first sub back-end package 750(1) may be coupled to the sub back-end link 742 of the back-end package 740. Although not shown in the drawing, the sub back-end link 752(1) of the first sub back-end package 750(1) may also be coupled to the sub back-end link of the second sub back-end package. In the same manner, the sub back-end link 752(L) of the "L"th sub back-end package 750(L) may be coupled to the sub back-end link of the "L−1"th sub back-end package. Thus, the back-end package 740 and the sub back-end packages 750(1)-750(L) may be coupled in a daisy chain scheme. The daisy chain scheme refer to the back-end package 740 and the sub back-end packages 750(1)-750(L) that are connected in series. In the implementations, the daisy chain scheme comprises the first to fourth daisy chains, each chain connecting two of the back-end package 740 and the sub back-end packages 750(1)-750(L).

Figure 17:
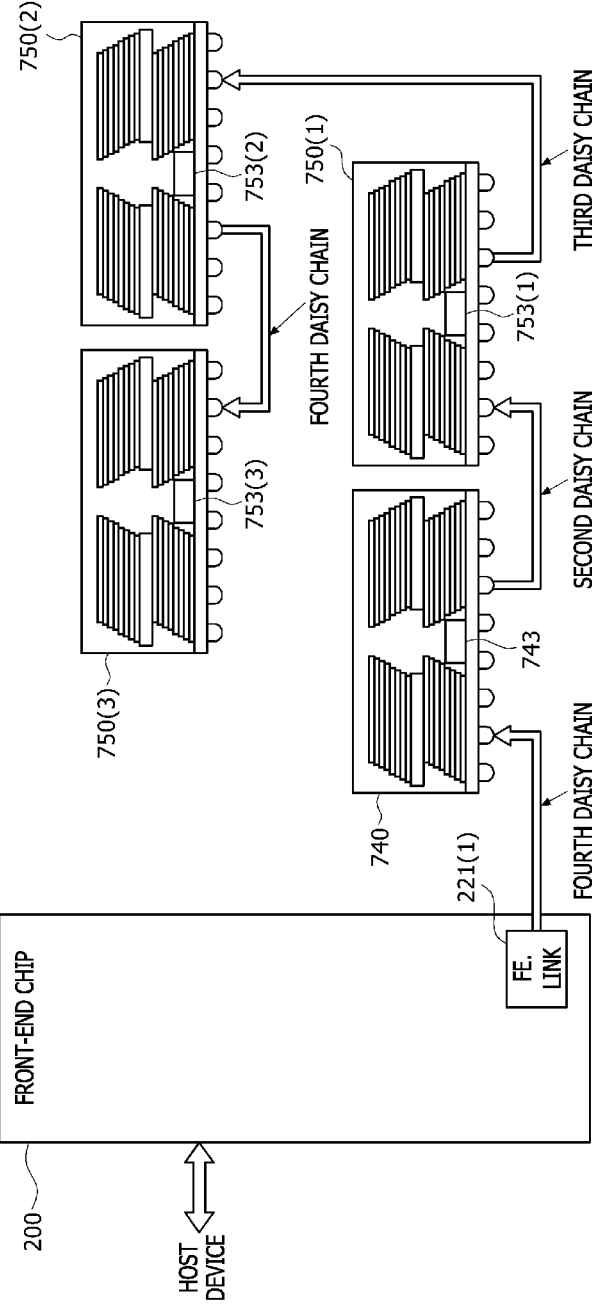
FIG. 17 is a diagram illustrating an example of a configuration in which a back-end package and three sub back-end packages are coupled to a front-end chip in a daisy chain scheme according to an embodiment of the disclosed technology.

FIG. 17 is a diagram illustrating an example of the configuration in which a back-end package 740 and three sub back-end packages 750(1), 750(2), and 750(3) are coupled to a front-end chip in a daisy chain scheme according to an embodiment of the disclosed technology. In FIG. 17, the same reference numerals as those of FIGS. 14 to 16 denote the same components. This example may correspond to the case in which "L" is 3 in the example described with reference to FIG. 14. Referring to FIG. 17, the first daisy chain connection structure may be configured between a front-end chip 200 and the back-end package 740. Thus, the front-end link 221(1) of the front-end chip 200 may communicate with the back-end link of the back-end chip 743 that constitutes the back-end package 740. The second daisy chain connection structure may be configured between the back-end package 740 and the first sub back-end package 750(1). Thus, the back-end link of the back-end chip 743 that constitutes the back-end package 740 may communicate with the sub back-end link of the sub back-end chip 753(1) that constitutes the first sub back-end package 750(1). The third daisy chain connection structure may be configured between the first sub back-end package 750(1) and the second sub back-end package 750(2). Thus, the sub back-end link of the back-end chip 753(1) that constitutes the first sub back-end package 750(1) may communicate with the sub back-end link of the sub back-end chip 753(2) that constitutes the second sub back-end package 750(2). The fourth daisy chain connection structure may be configured between the second sub back-end package 750(2) and the third sub back-end package 750(3). Thus, the sub back-end link of the sub back-end chip 753(2) that constitutes the second sub back-end package 750(2) may communicate with the sub back-end link of the sub back-end chip 753(3) that constitutes the third sub back-end package 750(3). According to such connection structures, the number of connections of the sub back-end packages may be freely adjusted regardless of the front-end chip 200.

Figure 18:
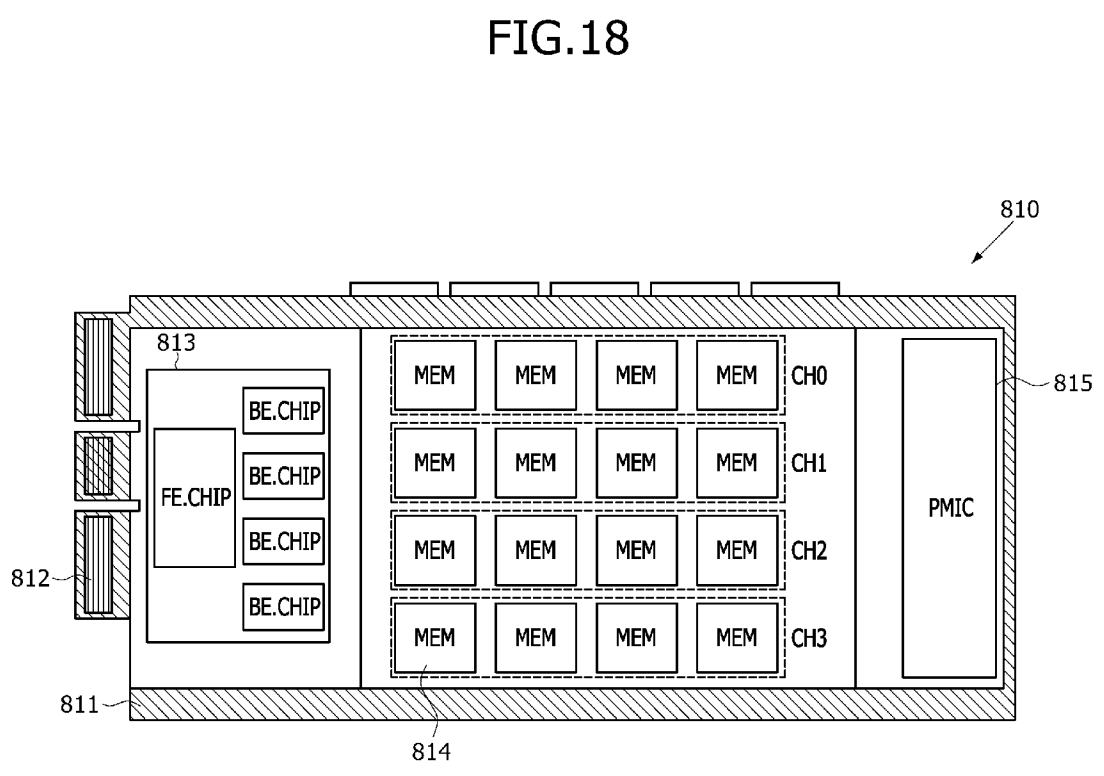

FIG. 18 is a diagram illustrating an example of a storage module 810 that employs a storage architecture according to an embodiment of the disclosed technology. Referring to FIG. 18, the storage module 810 may include a storage architecture 813, a plurality of memory chips (MEMs) 814, and a power management chip (PMIC) 815. The storage architecture 813 may be disposed on a substrate 811, for example, in the first region of the substrate 811. The substrate 811 may include a socket that may be coupled to, for example, a connector on a board. Notch pins 812 may be disposed in the socket to enable communication with a host device through the connector. The plurality of memory chips 814 may be disposed in the second region of the substrate 811. The plurality of memory chips 814 may be respectively disposed on an upper surface and a lower surface of the substrate 811. The power management chip 815 may be disposed in the third region of the substrate 811. The power management chip 815 may perform power supply and power management in the storage module 810. The first region may be a region closest to the notch pins 812 of the substrate 811. The third region may be a region furthest from the notch pins 812 of the substrate 811. The second region may be a region between the first region and the third region.

The storage architecture 813 may include a front-end chip FE.CHIP, and four back-end chips BE.CHIPs. The storage architecture 813 may be the same as the storage architecture (100A of FIG. 1) described with reference to FIG. 1, except that the number of back-end chips is different. Accordingly, the description of the front-end chip 200 described with reference to FIG. 2 may be equally applied to the front-end chip FE.CHIP that constitutes the storage architecture 813. In addition, the descriptions of the back-end chips 300B, 300C, and 300E described with reference to FIGS. 4, 5, and 7, respectively, may be equally applied to the back-end chips BE.CHIPs that constitute the storage architecture 813. Accordingly, the front-end chip FE.CHIP of the storage architecture 813 may perform the interfacing and control operations for the host device. The back-end chips BE.CHIPs of the storage architecture 813 may perform the interfacing and control operations for the memory chips 814. That is, the front-end chip FE.CHIP might not affect the interfacing and control operations for the memory chips 814. Similarly, the back-end chips BE.CHIPs might not affect the interfacing and control operations for the host device.

Each of the memory chips 814 may be in the form of a chip or a package. The memory chips 814 may be disposed to be allocated to a plurality of memory channels. As illustrated in FIG. 18, four memory chips 814 may be disposed in each of four channels CH0-CH3. Assuming that the memory chips 814 are respectively disposed on the upper surface and the lower surface of the substrate 811 and each of the memory chips 814 has a capacity of 16 GB, a capacity of 128 GB may be allocated to each of the channels CH0-CH3, and a capacity of 512 GB may be allocated to all channels CH0-CH3. The memory devices 814 of the first channel CH0 may communicate with the first back-end chip BE.CHIP among the four back-end chips BE.CHIPs. The memory devices 814 of the second channel CH1 may communicate with the second back-end chip BE.CHIP. The memory devices 814 of the third channel CH2 may communicate with the third back-end chip BE.CHIP. In addition, the memory devices 814 of the fourth channel CH3 may communicate with the fourth back-end chip BE.CHIP.

Figure 19:
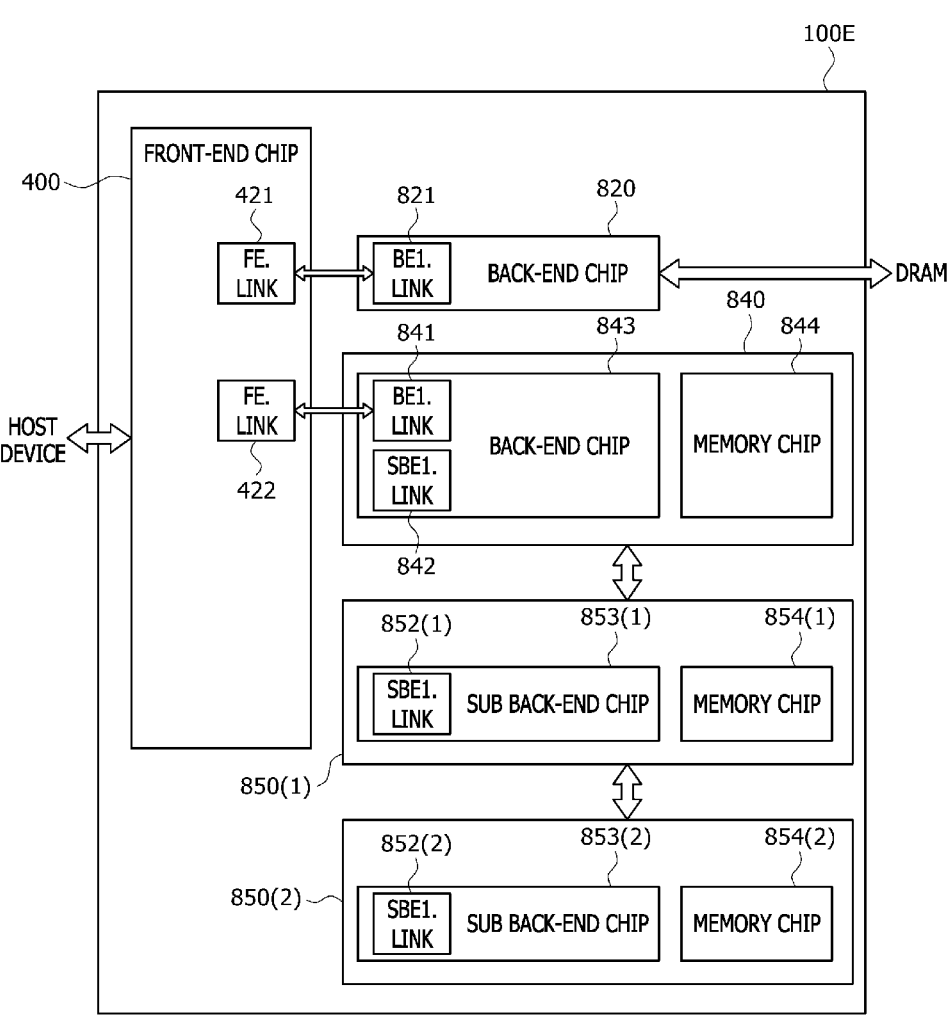
FIG. 19 is a block diagram illustrating a storage architecture according to yet another embodiment of the disclosed technology.

FIG. 19 is a block diagram illustrating a storage architecture 100E according to still yet another embodiment of the disclosed technology. Referring to FIG. 19, the storage architecture 100E may include a front-end chip 400, a back-end chip 820, a back-end package 840, and a plurality of, for example, two sub back-end packages 850(1) and 850(2). The front-end chip 400 may have the same configuration as the front-end chip 400 described with reference to FIG. 10. The back-end chip 820 may have the same configuration as the back-end chip 500 described with reference to FIG. 10. Accordingly, the back-end chip 820 may be coupled to a first front-end link 421 of the front-end chip 400 through a first back-end link 821. The back-end chip 820 may perform the interfacing and control operations for a first memory device, for example, a DRAM device. The back-end package 840 may have the same configuration as the back-end package (500 of FIG. 10) described with reference to FIG. 10. Accordingly, the back-end package 840 may be coupled to a second front-end link 422 of the front-end chip 400 through a second back-end link 841 of the second back-end chip 843. The second back-end chip 843 may perform the interfacing and control operations for the memory chip 844 that constitutes the back-end package 840. The sub back-end link 842 of the second back-end chip 843 that constitutes the back-end package 840 may be coupled to the sub back-end link 852(1) of the sub back-end chip 853(1) that constitutes the first sub back-end package 850(1). The sub back-end chip 853(1) may perform the interfacing and control operations for the memory chip 854(1) that constitutes the first sub back-end package 850(1). The sub back-end link 852(1) of the first sub back-end package 850(1) may also be coupled to the sub back-end link 852(2) of the sub back-end chip 853(2) that constitutes the second sub back-end package 850(2). The sub back-end chip 853(2) may perform the interfacing and control operations for the memory chip 854(2) that constitutes the second sub back-end package 850(2).

Figure 20:
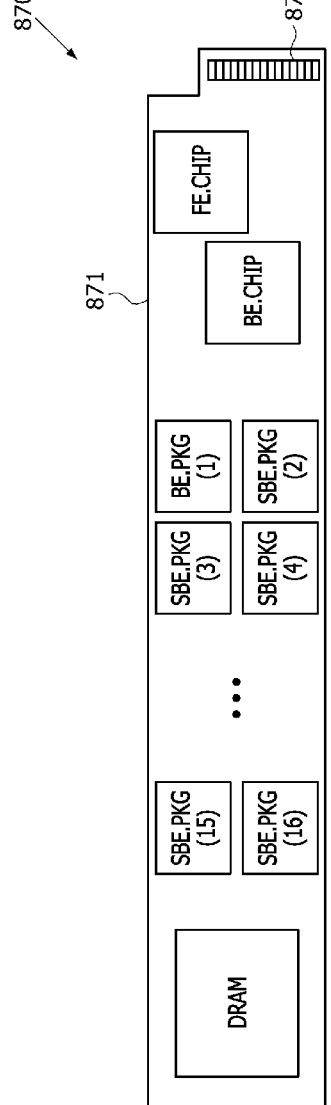
FIG. 20 is a diagram illustrating an example of a storage module that employs the storage architecture of FIG. 19.

FIG. 20 is a diagram illustrating an example of a storage module 870 that employs the storage architecture 100E of FIG. 19. Referring to FIG. 20, the storage module 870 according to the present example may include a substrate 871 that has a socket on which a notch pin 872 is disposed. A front-end chip FE.CHIP may be disposed in a first region of the substrate 871. A back-end chip BE.CHIP may be disposed in a second region of the substrate 871. The first region of the substrate 871 may be a region closest to the notch pin 872, and the second region may be a region adjacent to the first region. In a third region of the substrate 871, a back-end package BE.PKG(1) and a plurality of, for example, first to fifteenth sub back-end packages SBE.PKG (2)-SBE.PKG(16) may be disposed. A DRAM device DRAM may be disposed in a fourth region of the substrate 871. As described with reference to FIG. 19, the front-end chip FE.CHIP may be coupled to the back-end chip BE.CHIP and the back-end package BE.PKG(1). The front-end chip FE.CHIP may perform an interfacing operation for a host device through the notch pin 872. The back-end chip BE.CHIP may perform the interfacing and control operations for the DRAM device DRAM. The back-end package BE.PKG(1) and the sub back-end packages SBE.PKG(2)-SBE.PKG(16) may be coupled to each other in a daisy chain scheme.

FIG. 21 is a block diagram illustrating configurations of a front-end link 1100 and a back-end link 2100 of a storage architecture according to an embodiment of the disclosed technology. The configurations of the front-end link 1100 and back-end link 2100 may be applied to various examples described with reference to FIGS. 1 to 20. As in the various examples so far, the front-end link 1100 and the back-end link 2100 may be used for communication between the front-end chip and the back-end chip.

Referring to FIG. 21, the front-end link 1100 may include a link layer 1110, a physical layer 1120, and a clock measurement module (CMM). The link layer 1110 may include a flow controller 1111 and a packet decoder 1112. The flow controller 1111 of the link layer 1110 may perform packet flow control in transmitting a packet to the back-end link 2100. The packet decoder 1112 of the link layer 1110 may perform an error detection function for a packet that is transmitted from the back-end link 2100. The link layer 1110 may generate and output a lane activation signal LN_A. The lane activation signal LN_A that is output from the link layer 1110 may be transmitted to a transmitter 1121 of the physical layer 1120 and the back-end link 2100. The link layer 1110 may receive the lane activation signal LN_A that is transmitted from the back-end link 2100.

The physical layer 1120 may include the transmitter (TX) 1121 and a receiver (RX) 1122. The transmitter 1121 may transmit the signal that is transmitted from the link layer 1110 to the back-end link 2100. The receiver 1122 may transmit the signal that is transmitted from the back-end link 2100 to the link layer 1110. The receiver 1122 may include a phase-locked loop (PLL) and a clock data recovery circuit (CDR). The receiver 1122 may receive the lane activation signal LN_A that is transmitted from the back-end link 2100. The clock measurement module 1130 may receive a clock signal from a reference clock generator (REF) 3100.

The back-end link 2100 may include a link layer 2110, a physical layer 2120, and a clock measurement module (CMM) 2130. The link layer 2110 may include a flow controller 2111 and a packet decoder 2112. The flow controller 2111 of the link layer 2110 may perform packet flow control in transmitting packets to the front-end link 1100. The packet decoder 2112 of the link layer 2110 may perform an error detection function for the packets that are transmitted from the front-end link 1100. The link layer 2110 may generate and output the lane activation signal LN_A. The lane activation signal LN_A that is output from the link layer 2110 may be transmitted to a transmitter 2122 of the physical layer 2120 and the front-end link 1100. The link layer 2110 may receive the lane activation signal LN_A that is transmitted from the front-end link 1100. The physical layer 2120 may include a receiver (RX) 2121 and the transmitter (TX) 2122. The receiver 2121 may transmit the signal that is transmitted from the front-end link 1100 to the link layer 2110. The receiver 2121 may include a phase-locked loop (PLL) and a clock data recovery circuit (CDR). The receiver 2121 may receive the lane activation signal LN_A that is transmitted from the front-end link 1100. The transmitter 2122 may transmit the signal that is transmitted from the link layer 2110 to the front-end link 1100. The clock measurement module 2130 may receive a clock signal from the reference clock generator (REF) 3100.

Each of the front-end link 1100 and the back-end link 2100 may include general purpose input output GPIO pins. The transmission of the lane activation signal LN_A from the front-end link 1100 to the back-end link 2100 and the transmission of the lane activation signal LN_A from the back-end link 2100 to the front-end link 1100 may be performed through the GPIO pins. Each of the transmitter 1121 of the front-end link 1100 and the transmitter 2122 of the back-end link 2100 may include a TXDP pin and a TXDN pin as differential data output pins. Although not shown in the drawing, the TXDP pin may act as a positive output terminal, and the TXDN pin may act as a negative output terminal. Each of the receiver 1122 of the front-end link 1100 and the receiver 2121 of the back-end link 2100 may include an RXDP pin and an RXDN pin as differential data input pins. Although not shown in the drawing, the RXDP pin may act as a positive input terminal, and the RXDN pin may act as a negative input terminal. The signals from the transmitter 1121 of the front-end link 1100 may be output as a differential data pair from the TXDP pin and the TXDN pin of the front-end link 1100, and may be transmitted to the RXDP pin and the RXDN pin of the back-end link 2100. Similarly, the signals from the transmitter 2122 of the back-end link 2100 may be output as a differential data pair from the TXDP pin and the TXDN pin of the back-end link 2100, and may be transmitted to the RXDP pin and the RXDN pin of the front-end link 1100.

FIG. 22 is a block diagram illustrating configurations of a front-end link 1200 and a back-end link 2200 of a storage architecture according to another embodiment of the disclosed technology. The configurations of the front-end link 1200 and the back-end link 2200 according to the present example may also be applied to various examples described with reference to FIGS. 1 to 20. As in the various examples so far, the front-end link 1200 and the back-end link 2200 may be used for communication between the front-end chip and the back-end chip.

Referring to FIG. 22, the front-end link 1200 may include a link layer 1210, a physical layer 1220, and a phase-locked loop (PLL) 1230. The link layer 1210 may include a flow controller 1211 and a packet decoder 1212. The flow controller 1211 of the link layer 1210 may perform packet flow control in transmitting packets to the back-end link 2200. The packet decoder 1212 of the link layer 1210 may perform an error detection function for the packets that are transmitted from the back-end link 2200. The link layer 1210 may generate and output a lane activation signal LN_A. The lane activation signal LN_A that is output from the link layer 1210 may be transmitted to the transmitter 1221 of the physical layer 1220, the phase-locked loop 1230, and the back-end link 2200. The link layer 1210 may receive the lane activation signal LN_A that is transmitted from the back-end link 2200.

The physical layer 1220 may include a transmitter (TX) 1221 and a receiver (RX) 1222. The transmitter 1221 may transmit the signal that is transmitted from the physical layer 1220 to the back-end link 2200. The receiver 1222 may transmit the signal that is transmitted from the back-end link 2200 to the link layer 1210. Unlike the front-end link (1100 of FIG. 21) of FIG. 21, the receiver 1222 that constitutes the physical layer 1220 of the front-end link 1200 may include a delay locked loop (DLL). The receiver 1222 may receive the lane activation signal LN_A that is transmitted from the back-end link 2200. The phase-locked loop 1230 may receive a clock signal from a reference clock generator (REF) 3200. The phase-locked loop 1230 may lock the clock signal that is transmitted from the reference clock generator 3200 based on the lane activation signal LN_A that is transmitted from the link layer 1210 or from the back-end link 2200, and then, may transmit a phase-locked clock signal CKP to the back-end link 2200. The phase-locked loop 1230 may receive the lane activation signal LN_A that is transmitted from the back-end link 2200.

The back-end link 2200 may include a link layer 2210 and a physical layer 2220. The link layer 2210 may include a flow controller 2211 and a packet decoder 2212. The flow controller 2211 of the link layer 2210 may perform packet flow control in transmitting packets to the front-end link 1200. The packet decoder 2212 of the link layer 2210 may perform an error detection function for the packets that are transmitted from the front-end link 1200. The link layer 2210 may generate and output a lane activation signal LN_A. The lane activation signal LN_A that is output from the link layer 2210 may be transmitted to a transmitter 2222 of the physical layer 2220 and the front-end link 1200. The link layer 2210 may receive the lane activation signal LN_A that is transmitted from the front-end link 1200. The physical layer 2220 may include a receiver (RX) 2221 and the transmitter (TX) 2222. The receiver 2221 may transmit the signal that is transmitted from the front-end link 1200 to the link layer 2210. The receiver 2221 may include a delay locked loop (DLL). The receiver 2221 may receive the lane activation signal LN_A that is transmitted from the front-end link 1200. The transmitter 2222 may transmit the signal that is transmitted from the link layer 2210 to the front-end link 1200.

Each of the front-end link 1200 and the back-end link 2200 may include GPIO pins. The transmission of the lane activation signal LN_A from the front-end link 1200 to the back-end link 2200 and the transmission of the lane activation signal LN_A from the back-end link 2200 to the front-end link 1200 may be performed through the GPIO pins. Each of the transmitter 1221 of the front-end link 1200 and the transmitter 2222 of the back-end link 2200 may include a TXDP pin and a TXDN pin as differential data output pins. Although not shown in FIG. 22, the TXDP pin may act as a positive output terminal, and the TXDN pin may act as a negative output terminal. Each of the receiver 1222 of the front-end link 1200 and the receiver 2221 of the back-end link 2200 may include an RXDP pin and an RXDN pin as differential data input pins. Although not shown in FIG. 22, the RXDP pin may act as a positive input terminal, and the RXDN pin may act as a negative input terminal. The signals from the transmitter 1221 of the front-end link 1200 may be output as a differential data pair from the TXDP and TXDN pins of the front-end link 1200, and may be transmitted to the RXDP and RXDN pins of the back-end link 2200. Similarly, the signals from the transmitter 2222 of the back-end link 2200 may be output as a differential data pair from the TXDP and TXDN pins of the back-end link 2200, and may be transmitted to the RXDP and RXDN pins of the front-end link 1200.

FIG. 23 is a block diagram illustrating configurations of a front-end link 1300 and a back-end link 2300 of a storage architecture according to yet another embodiment of the disclosed technology. The configurations of the front-end link 1300 and the back-end link 2300 according to the present example may also be applied to various examples described with reference to FIGS. 1 to 20. As in the various examples so far, the front-end link 1300 and the back-end link 2300 may be used for communication between the front-end chip and the back-end chip.

Referring to FIG. 23, the front-end link 1300 may include a link layer 1310, a physical layer 1320, and a phase-locked loop (PLL) 1330. The link layer 1310 may include a flow controller 1311 and a packet decoder 1312. The flow controller 1311 of the link layer 1310 may perform packet flow control in transmitting packets to the back-end link 2300. The packet decoder 1312 of the link layer 1310 may perform an error detection function for the packets that are transmitted from the back-end link 2300. The link layer 1310 may generate and output a lane activation signal LN_A. The lane activation signal LN_A that is output from the link layer 1310 may be transmitted to a transmitter 1321 of the physical layer 1320, the phase-locked loop 1330, and the back-end link 2300. The link layer 1310 may receive the lane activation signal LN_A that is transmitted from the back-end link 2300.

The physical layer 1320 may include the transmitter (TX) 1321 and a receiver (RX) 1322. The transmitter 1321 may transmit the signal that is transmitted from the link layer 1310 to the back-end link 2300. The receiver 1322 may transmit the signal that is transmitted from the back-end link 2300 to the link layer 1310. The receiver 1322 may receive the lane activation signal LN_A that is transmitted from the back-end link 2300. The phase-locked loop 1330 may receive a clock signal from a reference clock generator (REF) 3300. The phase-locked loop 1330 may lock the clock signal that is received from the reference clock generator 3300 based on the lane activation signal LN_A that is transmitted from the link layer 1310 or transmitted from the back-end link 2300, and then, may transmit a phase-locked clock signal CKP to the back-end link 2300. The phase-locked loop 1330 may receive the lane activation signal LN_A that is transmitted from the back-end link 2300.

The back-end link 2300 may include a link layer 2310 and a physical layer 2320. The link layer 2310 may include a flow controller 2311 and a packet decoder 2312. The flow controller 2311 of the link layer 2310 may perform packet flow control in transmitting packets to the front-end link 1300. The packet decoder 2312 of the link layer 2310 may perform an error detection function for the packets that are transmitted from the front-end link 1300. The link layer 2310 may generate and output a lane activation signal LN_A. The lane activation signal LN_A that is output from the link layer 2310 may be transmitted to the transmitter 2322 of the physical layer 2320 and the front-end link 1300. The link layer 2310 may receive the lane activation signal LN_A that is transmitted from the front-end link 1300. The physical layer 2320 may include a receiver (RX) 2321 and the transmitter (TX) 2322. The receiver 2321 may transmit the signal that is transmitted from the front-end link 1300 to the link layer 2310. The receiver 2321 may receive the lane activation signal LN_A that is transmitted from the front-end link 1300. The transmitter 2322 may transmit the signal that is transmitted from the link layer 2310 to the front-end link 1300.

Each of the front-end link 1300 and the back-end link 2300 may include GPIO pins. The transmission of the lane activation signal LN_A from the front-end link 1300 to the back-end link 2300 and the transmission of the lane activation signal LN_A from the back-end link 2300 to the front-end link 1300 may be performed through the GPIO pins. Each of the transmitter 1321 of the front-end link 1300 and the transmitter 2322 of the back-end link 2300 may include a TXDP pin and a TXDN pin as differential data output pins. Although not shown in FIG. 23, the TXDP pin may act as a positive output terminal, and the TXDN pin may act as a negative output terminal. Each of the receiver 1322 of the front-end link 1300 and the receiver 2321 of the back-end link 2300 may include an RXDP pin and an RXDN pin as differential data input pins. Although not shown in FIG. 23, the RXDP pin may act as a positive input terminal, and the RXDN pin may act as a negative input terminal. The signal from the transmitter 1321 of the front-end link 1300 may be output as a differential data pair from the TXDP pin and the TXDN pin of the front-end link 1300, and may be transmitted to the RXDP pin and the RXDN pin of the back-end link 2300. Similarly, the signal from the transmitter 2322 of the back-end link 2300 may be output as a differential data pair from the TXDP pin and the TXDN pin of the back-end link 2300, and may be transmitted to the RXDP pin and the RXDN pin of the front-end link 1300.

Figure 24:
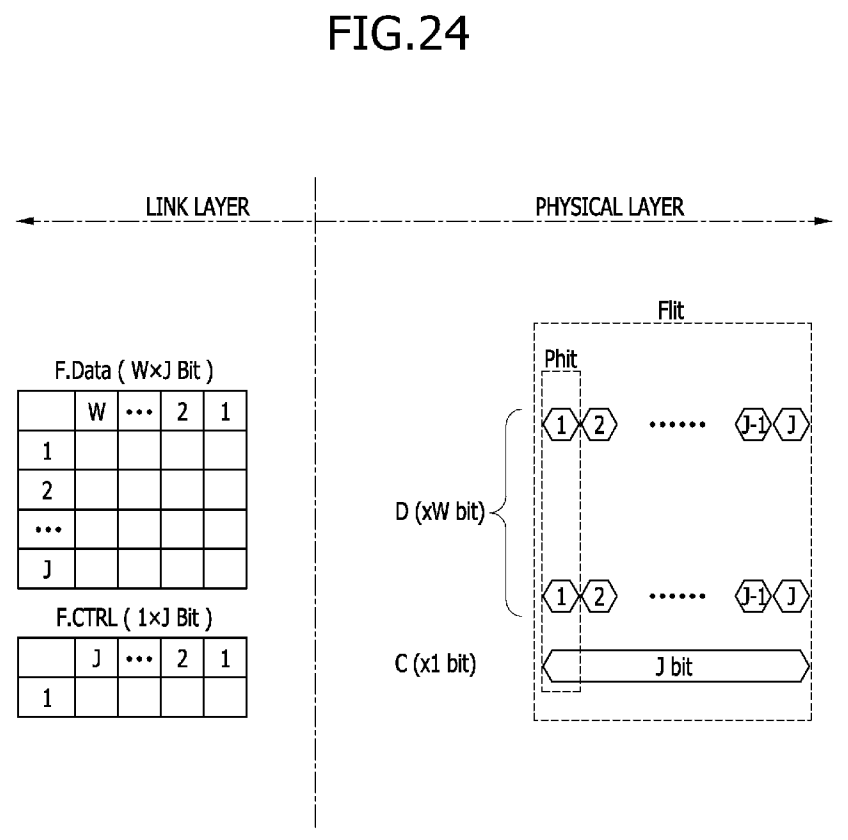

FIG. 24 is a diagram illustrating an example of packet transmission processes in the front-end links and the back-end links of FIGS. 21 to 23. The packet transmission processes may be performed by the same mechanism in the front-end link and the back-end link, and accordingly, it will be described below on the basis of the front-end link.

Referring to FIG. 24, the packet that is transmitted between the front-end link and the back-end link may be composed of at least one flow control digit (hereinafter, referred to as "Flit"). In addition, one Flit may be composed of at least one physical digit (hereinafter, referred to as "Phit"). In the link layer of the front-end link, the upper layer data F.DATA and flow control data F.CTRL of one Flit may be separated and processed. As illustrated in FIG. 24, in the link layer, the upper layer data F.DATA may be configured in a table form in which a row is composed of "J" bits ("J" is a natural number) and a column is composed of "W" bits ("W" is a natural number). The flow control data (F.CTRL) may be configured in a table form in which a row is composed of 1 bit and a column is composed of "J" bits. The actual data is omitted from FIG. 24.

In an example, the flow control data F.CTRL that has a value of "0000" may indicate an idle state. The flow control data F.CTRL that has a value of "0001" may indicate that the upper layer data F.DATA corresponds to the first message. The flow control data F.CTRL that has a value of "0011" may indicate that the upper layer data F.DATA corresponds to the second message. Similarly, the flow control data F.CTRL that has a value of "0111" may indicate that the upper layer data F.DATA corresponds to the third message. As such, the flow control data F.CTRL may indicate whether there is an idle state and which message the upper layer data F.DATA corresponds to. The size of the data that is transmitted to the link layer may be smaller than the size of Flit, which may be determined by combining the flow control data F.CTRL and the upper layer data F.DATA that are generated by performing packet decoding in the link layer. When the size of the data to be transmitted from the link layer to the upper layer is smaller than the size of Flit, that is, the data corresponds to a low density, the Flit data may be used together in the link layer and the upper layer. On the other hand, when the size of the data to be transmitted from the link layer to the upper layer is the same as the size of Flit, that is, the data corresponds to the max density, the link layer may transmit the Flit data to the upper layer. According to such method, there is no need to include a separate header/tail for information other than data in the packet.

The upper layer data F.DATA and the flow control data F.CTRL in the link layer may be processed in the form of a control packet part C and a data packet part D in the physical layer, respectively, and may be transmitted to the back-end link. As illustrated in FIG. 24, one Flit that is transmitted from the physical layer of the front-end link to the back-end link may include a control packet part C and a data packet part D. Each of the control packet part C and the data packet part D may have a data length of "J" bits. The control packet part C may have one data width, while the data packet part D may have "W" data widths. Assuming that the Phit is composed of 1 bit for one data width, one Phit may have a size of "W+1" bits including a 1-bit control packet part C and a "W"-bit data packet part D. In addition, one Flit may have a size of "J+(W×J)" bits including a "J"-bit control packet part C and a "W×J"-bit data packet part D. In other words, the packet transmission between the front-end link and the back-end link may be performed in units of "W+1" bits, which is physically the size of the Phit, and this process may be performed continuously "J" times until all "J+(W× J)" bits, which are the size of the Flit, are transmitted.

Figure 25:
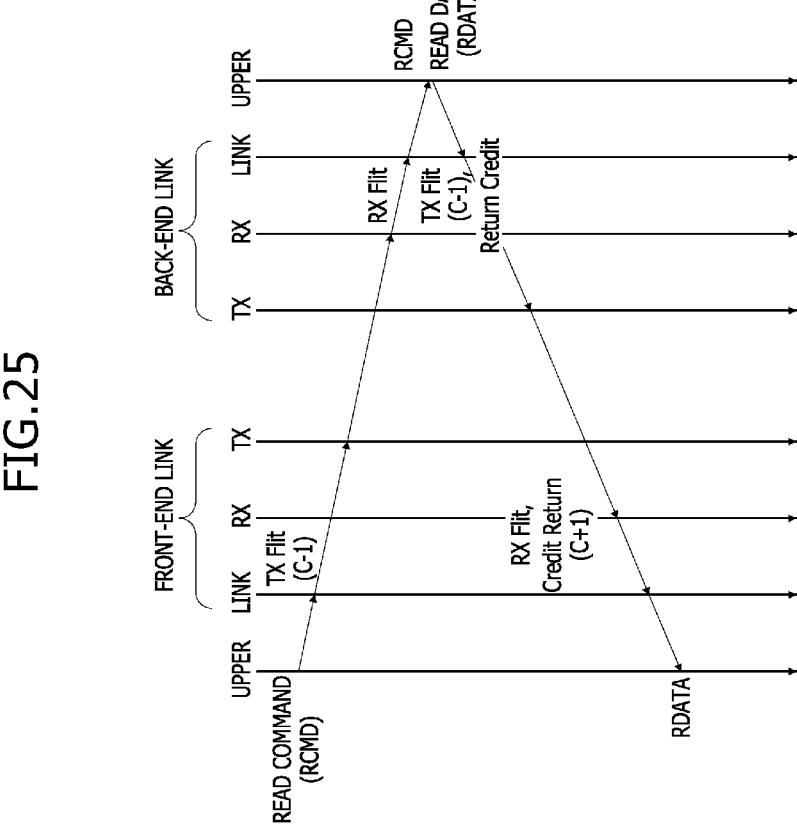
FIG. 25 is a diagram illustrating an example of a communication process from the front-end link to the back-end link of FIGS. 21 to 23.

FIG. 25 is a diagram illustrating an example of the communication process from the front-end links to the back-end links of FIGS. 21 to 23. The following description may be equally applied to the communication process from the back-end link to the front-end link. In addition, it is assumed that the communication between the front-end link and the back-end link is performed in the peer-to-peer scheme. In this example, a case will be exemplified in which a read command is transmitted from the front-end link to the back-end link and read data is transmitted from the back-end link to the front-end link.

Referring to FIG. 25, the front-end link and the back-end link may exchange their credit values in advance. The link layer LINK of the front-end link may transmit the read command RCMD that is transmitted from the upper layer (i.e., the logic circuit in the front-end chip) to the receiver RX of the back-end link in the format of a transmission Flit TX Flit through the transmitter TX of the physical layer. In this case, the link layer LINK of the front-end link may refer to the reception availability of the back-end link by referring to the credit C value of the back-end link. The link layer LINK of the front-end link may deduct the credit C by the number of transmitted Flits (i.e., "C−1"), while transmitting the read command RCMD.

The receiver RX of the back-end link may receive the transmission Flit TX Flit from the front-end link as a reception Flit RX Flit. The receiver RX of the back-end link may transmit credits C equal to the number of normally received Flits to the front-end link. The receiver RX of the back-end link may transmit the reception Flit RX Flit in the format of a read command RCMD to the upper layer (i.e., the logic circuit in the back-end chip) through the link layer LINK. The upper layer of the back-end link may transmit the read data RDATA that is read from a memory device to the link layer LINK. The link layer LINK of the back-end link may transmit the read data RDATA to the receiver RX of the front-end link in the form of a transmission Flit TX Flit through the transmitter TX of the physical layer. In this case, the link layer LINK of the back-end link may encode the read data RDATA, together with the credit C, and may transmit encoded read data RDATA with the credit C to the front-end link. In addition, the link layer LINK of the back-end link may deduct the credit C by the number of transmitted Flits (i.e., "C−1"), while transmitting the read data RDATA to the front-end link.

The receiver RX of the front-end link may receive the transmission Flit TX Flit from the back-end link as the reception Flit RX Flit. The receiver RX of the front-end link that receives the reception flit RX Flit may transmit the reception Flit RX Flit to the upper layer in the form of read data RDATA through the link layer LINK. In this case, the link layer of the front-end link may add the credit C by the number of received Flits (i.e., "C+1"). Although not shown in FIG. 25, when there is no read data RDATA to be transmitted to the front-end link from the back-end link, the Flits for credit return may be generated and may be returned immediately to the front-end link, or return may be delayed until the read data RDATA is transmitted to the front-end link.

Figure 26:
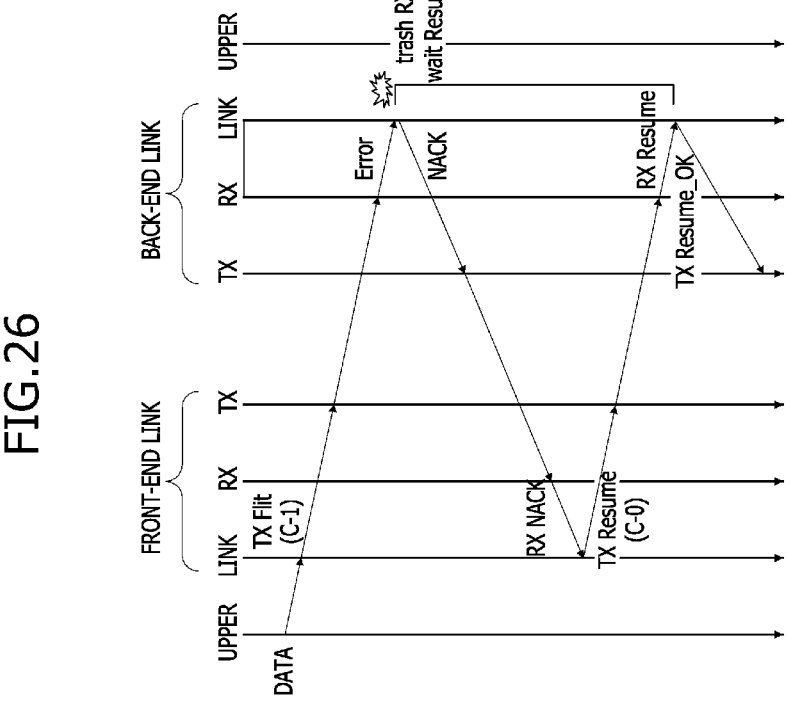
FIG. 26 is a diagram illustrating another example of the communication process from the front-end link to the back-end link of FIGS. 21 to 23.

FIG. 26 is a diagram illustrating another example of a communication process from the front-end link to the back-end link of FIGS. 21 to 23. The following description may be equally applied to the communication process from the back-end link to the front-end link. In addition, it is assumed that the communication between the front-end link and the back-end link is performed in a peer-to-peer scheme. In this example, a case will be exemplified in which data is transmitted from the front-end link to the back-end link. The same method may be applied to the case in which a command is transmitted instead of data.

Referring to FIG. 26, the front-end link and the back-end link may exchange their credit values in advance. The link layer LINK of the front-end link may transmit the data DATA that is transmitted from the upper layer (i.e., the logic circuit in the front-end chip) to the receiver RX of the back-end link in the form of a transmission Flit TX Flit through the transmitter TX of the physical layer. The link layer LINK of the front-end link may deduct the credit C by the number of transmitted Flits (i.e., "C−1"), while transmitting the read command RCMD. The receiver RX of the back-end link may receive the transmission Flit TX Flit from the front-end link as a reception Flit RX Flit, and may transmit the transmission Flit TX Flit to the link layer LINK. When an error is included in the reception Flit RX Flit, the link layer LINK of the back-end link may block the data transmission to the upper layer, and may transmit a resume request NACK to the receiver RX of the front-end link through the transmitter TX of the back-end link. In addition, the back-end link may stop all reception operations until the front-end link transmits a resume message RESUME.

The link layer LINK of the front-end link, which has received the resume request RX NACK from the receiver RX of the front-end link may transmit a transmission resume message TX RESUME to the receiver RX of the back-end link in response to the received resume request RX NACK. In this case, the link layer LINK of the front-end link might not perform the credit C addition/subtraction operation. The point in time when the link layer LINK of the front-end link transmits a transmission resume message TX RESUME to the back-end link may be set as unreturned credit. For example, if the Flits that correspond to 4 credits are transmitted from the front-end link to the back-end link and the third credit is normally returned, the link layer LINK of the front-end link may retransmit the Flit that corresponds to the fourth credit to the back-end link.

The receiver RX of the back-end link, which has received the transmission resume message TX RESUME from the transmitter TX of the front-end link as the reception resume message RX RESUME may transmit a reception resume message RX RESUME to the link layer LINK of the back-end link. The link layer LINK of the back-end link may resume the reception operation after transmitting a resume request TX_RESUME_OK to the receiver RX of the front-end link through the transmitter TX. The front-end link may transmit the data DATA back to the back-end link in response to the resume request RESUME_OK. Although not shown in FIG. 26, when the back-end link does not receive the transmission resume message TX RESUME or the front-end link does not receive the resume request TX_RE-SUME_OK, the front-end link may time out.

While various embodiments have been described above, variations and improvements of the disclosed embodiments and other embodiments may be made based on what is described or illustrated in this document.

What is claimed is:

1. A device for implementing a storage architecture, comprising:
   a front-end chip configured to perform first interfacing with a first device;
   a first back-end package including a package substrate, a first back-end chip configured to perform second interfacing with second devices and disposed over the package substrate, a plurality of memory chips disposed over the package substrate, and a molding structure surrounding the first back-end chip and the plurality of memory chips; and
   a second back-end package including a second back-end chip and a second memory chip,
   wherein a first portion of the plurality of memory chips are stacked over a first region of the package substrate and a second portion of the plurality of memory chips are stacked over a second region of the package substrate, wherein a first intermediate substrate is interposed between at least some of the memory chips in the first portion and a second intermediate substrate is interposed between at least some of the memory chips in the second portion,
   wherein the front-end chip includes a first front-end link and a second front-end link for communicating with the first back-end chip and the second back-end chip, respectively,
   wherein the first back-end chip includes a first back-end link in communication with the first front-end link and the second back-end chip includes a second back-end link in communication with the second front-end link,
   wherein the front-end chip is physically separated from the first back-end chip and the second back-end chip to provide the storage architecture having a format different from a system on chip format and a physical separation between the front-end chip and the first back-end chip and the second back-end chip allows 1) the front-end chip to be replaceable separately from the first back-end chip and the second back-end chip while maintaining the first back-end chip and the second back-end chip and 2) the first back-end chip and the second back-end chip to be replaceable separately from the front-end chip while maintaining the front-end chip.

2. The device for the storage architecture of claim 1, wherein the first device is a host device, and the second devices are memory devices.

3. The device for the storage architecture of claim 1, wherein each of the second devices includes at least one of a volatile memory device, a non-volatile memory device, or an accelerator memory device.

4. The device for the storage architecture of claim 1, wherein the front-end chip, the first back-end chip, and the second back-end chip are configured in a chiplet structure in which the front-end chip, the first back-end chip, and the second back-end chip are physically separated to function independently of each other.

5. The device for the storage architecture of claim 1, wherein the front-end chip, the first back-end chip, and the second back-end chip are configured to be independently replaceable in response to any changes in a specification of at least one of the first device and the second devices.

6. The device for the storage architecture of claim 1, wherein the first interfacing has an operation speed that is higher than an operation speed of the second interfacing.

7. The device for the storage architecture of claim 1, wherein the front-end chip includes:
   a host interface configured to perform signal and data communication with the first device;
   a core logic circuit configured to process instructions and data in the front-end chip; and
   a stream switch logic circuit configured to control a transmission path of signals and data in the front-end chip.

8. The device for the storage architecture of claim 7, wherein the host interface includes:
   a physical layer coupled to the first device according to a peripheral component interconnect express (PCIe) standard or a compute express link (CXL) standard;
   an interface logic circuit configured to control signal and data processing in the host interface; and
   a link configured to provide a transmission path of the signals and data between the physical layer and the interface logic circuit.

9. The device for the storage architecture of claim 8, wherein the interface logic circuit is configured to process the signals and data that are transmitted from the link, and to transmit processed signals and data to the stream switch logic circuit.

10. The device for the storage architecture of claim 8, wherein the core logic circuit includes a first core circuit that has a first operation speed and a plurality of second core circuits that have a second operation speed lower than the first operation speed,
   wherein the first core circuit is coupled to a first instruction tightly-coupled memory circuit and a first data tightly-coupled memory circuit, and
   wherein each of the plurality of second core circuits is coupled to a second instruction tightly-coupled memory circuit and a second data tightly-coupled memory circuit.

11. The device for the storage architecture of claim 10, wherein the first instruction tightly-coupled memory circuit has a larger storage capacity than the second instruction tightly-coupled memory circuit, and
   wherein the second data tightly-coupled memory circuit has a larger storage capacity than the first data tightly-coupled memory circuit.

12. The device for the storage architecture of claim 7, wherein the front-end chip further includes a PCI logic circuit that is provided as a means for connecting peripheral devices of a PCI scheme to the front-end chip.

13. The device for the storage architecture of claim 7, wherein the front-end chip further includes an NVMe (non-volatile memory express) logic circuit configured to perform interfacing for NVMe devices.

14. The device for the storage architecture of claim 1, wherein each of the first back-end chip and the second back-end chip includes:
   a back-end link configured to communicate with the first front-end link or the second front-end link;
   an extreme memory profile enhancer (XMPE) that supports a memory profile function;
   a controller configured to control the second device; and
   a physical layer configured to perform interfacing with the second device.

15. The device for the storage architecture of claim 1, wherein each of the first back-end chip and the second back-end chip includes:
   a back-end link configured to communicate with the first front-end link or the second front-end link;

a first stream control logic circuit coupled to the back-end link through an internal bus;

a crossbar that adjusts a transmission path of signals and data in the first back-end chip or the second back-end chip;

a power management logic circuit configured to manage power in the first back-end chip or the second back-end chip;

an embedded application logic circuit configured to perform an application operation according to a programmed embedded application;

a tightly-coupled memory circuit that is used as a buffer memory circuit in the first back-end chip or the second back-end chip;

a memory management logic circuit configured to perform a control operation on the tightly-coupled memory circuit;

a second stream control logic circuit configured to provide a data transmission path between the memory management logic circuit and the crossbar; and a third stream control logic circuit configured to provide a data transmission path with the crossbar.

16. The device for the storage architecture of claim 1, wherein each of the first back-end chip and the second back-end chip includes:

a back-end link configured to communicate with the first front-end link or the second front-end link;

a network connection logic circuit configured to control a transmission path of signals and data within the first back-end chip or the second back-end chip;

stream control logic circuit configured to provide a transmission path of signals and data between the back-end link and the network connection logic circuit;

a core circuit configured to perform instructions and data processing within the first back-end chip and the second back-end chip; and a controller coupled to the second device through an external bus to control the second device.

17. The device for the storage architecture of claim 1, wherein each of the first back-end chip and the second back-end chip includes:

a back-end link configured to communicate with the first front-end link or the second front-end link;

a network connection logic circuit configured to control a transmission path of signals and data in the first back-end chip or the second back-end chip;

an interface layer configured to perform an interfacing operation during reading and writing of the second device;

a write protection logic circuit configured to protect against unwanted write operations in the second device; and a read protection logic circuit configured to protect software code that is stored in the second device.

18. The device for the storage architecture of claim 1, wherein the first front-end link and the second front-end link includes a first link layer and a first physical layer, and each of the first back-end link and the second back-end link includes a second link layer and a second physical layer, wherein the first link layer provides a path for packet transmission between an upper layer and the first physical layer in the front-end chip, wherein the first physical layer performs the packet transmission with the first back-end link or the second back-end link, wherein the second link layer provides a path for packet transmission between an upper layer and the second physical layer in the first back-end chip or the second back-end chip, and wherein the second physical layer performs the packet transmission with the first front-end link or the second front-end link.

19. The device for the storage architecture of claim 18, wherein the first link layer includes:

a first flow controller configured to perform packet flow control in transmitting the packet to the first back-end link or the second back-end link; and a first packet decoder configured to perform an error detection function for the packet that is transmitted from the first back-end link or the second back-end link, and wherein the second link layer includes:

a second flow controller configured to perform packet flow control in transmitting the packet to the first back-end link or the second back-end link; and a second packet decoder configured to perform an error detection function for the packet that is transmitted from the first back-end link or the second back-end link.

20. The device for the storage architecture of claim 19, wherein the first physical layer includes:

a first transmitter that transmits the packet from the first link layer to the first back-end link or the second back-end link; and a first receiver that transmits the packet from the first back-end link or the second back-end link to the first link layer, and wherein the second physical layer includes:

a second transmitter that transmits the packet from the second link layer to the first front-end link or the second front-end link; and a second receiver that transmits the packet from the first front-end link or the second front-end link to the second link layer.

21. The device for the storage architecture of claim 20, wherein each of the first receiver and the second receiver includes a phase-locked loop and a clock data recovery circuit.

22. The device for the storage architecture of claim 20, wherein each of the first front-end link, the second front-end link, the first back-end link, and the second back-end link further includes a clock measurement module that receives a clock signal from a reference clock generator.

23. The device for the storage architecture of claim 20, wherein the first link layer is configured to generate a first lane activation signal to transmit the first lane activation signal to the first transmitter, the second receiver, and the second link layer, and wherein the second link layer is configured to generate a second lane activation signal to transmit the second lane activation signal to the second transmitter, the first receiver, and the first link layer.

24. The device for the storage architecture of claim 20, wherein each of the first receiver and the second receiver includes a delay locked loop.

25. The device for the storage architecture of claim 20, wherein each of the first front-end link and the second front-end link further includes a phase-locked loop that receives a clock signal from a reference clock generator.

26. The device for the storage architecture of claim 20, wherein the first link layer is configured to generate a first lane activation signal to transmit the first lane activation signal to the first transmitter, the second receiver, and the second link layer, and wherein the second link layer is configured to generate a second lane activation signal to transmit the second lane activation signal to the second transmitter, the first receiver, and the first link layer.

* * * * *